US012418273B2

(12) United States Patent
Reinhardt et al.

(10) Patent No.: US 12,418,273 B2
(45) Date of Patent: Sep. 16, 2025

(54) ELECTROMECHANICAL DEVICE WITH ADJUSTABLE RESONANCE FREQUENCY

(71) Applicant: COMMISSARIAT À L'ENERGIE ATOMIQUE ET AUX ÉNERGIES ALTERNATIVES, Paris (FR)

(72) Inventors: Alexandre Reinhardt, Grenoble (FR); Bruno Reig, Grenoble (FR); Axel Sauvage, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1008 days.

(21) Appl. No.: 17/501,373

(22) Filed: Oct. 14, 2021

(65) Prior Publication Data

US 2022/0123727 A1 Apr. 21, 2022

(30) Foreign Application Priority Data

Oct. 19, 2020 (FR) ........................................ 2010704

(51) Int. Cl.
*H03H 9/25* (2006.01)
*H10N 30/30* (2023.01)
*H10N 30/87* (2023.01)

(52) U.S. Cl.
CPC ............. *H03H 9/25* (2013.01); *H10N 30/30* (2023.02); *H10N 30/87* (2023.02)

(58) Field of Classification Search
CPC .......... H10N 30/87; H10N 30/30; H03H 9/25; H03H 9/6403; H03H 9/6426; H03H 9/6436; H03H 9/02228; H03H 9/14514
See application file for complete search history.

(56) References Cited

U.S. PATENT DOCUMENTS 4,028,648 A * 6/1977 Hartmann .......... H03H 9/14508
333/195
4,065,735 A * 12/1977 Palfreeman .......... H03H 9/6446
333/195

(Continued)

FOREIGN PATENT DOCUMENTS

JP S63-92421 U 6/1988
JP 2011-259516 A 12/2011
JP 2015144418 A * 8/2015

OTHER PUBLICATIONS

Search Report as issued in French Patent Application No. 2010704, dated Jul. 15, 2021.

(Continued)

*Primary Examiner* — J. San Martin
(74) *Attorney, Agent, or Firm* — Pillsbury Winthrop Shaw Pittman LLP

(57) ABSTRACT

An electromechanical device includes a piezoelectric support delimited by a surface, or by two surfaces parallel to each other, and, on this support, a resonator for elastic waves propagating parallel to the surface or surfaces, the resonator including two reflectors that delimit the resonator and which are reflective for the waves, several interfacing transducers, to generate the waves from an electrical signal, and several transducers for controlling the resonance frequency, each transducer including a first electrode and a second electrode that are interdigitated, the transducers being arranged along the propagation path followed by the waves in the resonator, with, along the path, an alternation between interfacing transducer and tuning transducer.

15 Claims, 9 Drawing Sheets

(56) References Cited

U.S. PATENT DOCUMENTS

| | | |
|---|---|---|
| 5,010,269 A | 4/1991 | Hikita et al. |
| 5,351,022 A * | 9/1994 | Ruile .................. H03H 9/6436 333/195 |
| 2019/0305756 A1 | 10/2019 | Urata et al. |

OTHER PUBLICATIONS

Cross, P. S., et al., "Electronically variable surface-acoustic-wave velocity and tunable SAW resonators," Appl. Phys. Lett. 28, (1976), 3 pages.

* cited by examiner

ELECTROMECHANICAL DEVICE WITH ADJUSTABLE RESONANCE FREQUENCY

CROSS-REFERENCE TO RELATED APPLICATIONS

This application claims priority to French Patent Application No. 2010704, filed Oct. 19, 2020, the entire content of which is incorporated herein by reference in its entirety.

FIELD

The technical field is that of electromechanical devices that make use of the propagation of elastic waves for the purpose of carrying out electric resonator functions, these resonators being suitable to implement more complex functions such as filters, frequency references or others. These devices typically have resonance frequencies that can range from a few hundred kHz to a few GHz.

BACKGROUND

In this field, devices based on elastic surface wave ("SAW", for Surface Acoustic Wave) resonators are known. Such devices generally comprise a solid piezoelectric substrate, relatively thick. The elastic waves in question, of the Rayleigh wave type, surface transverse wave type ("STW"), or surface skimming bulk wave type ("SSBW"), propagate at the surface of the substrate, parallel to this surface.

Two reflectors, reflective for these surface waves and located facing one another, are then made on the surface of the substrate in order to form an elastic surface wave resonator. These reflectors can be obtained by depositing metal electrodes on the surface of the substrate, these electrodes each comprising several metal strips arranged periodically in order to form a kind of Bragg mirror.

In order to make it possible to electrically interact with this resonator, a transducer comprising two electrodes in the form of interdigital combs is generally fabricated on the surface of the substrate, between the two reflectors. These two electrodes are respectively connected to two connection terminals. An electric resonance, associated with an elastic wave resonance in the resonator, is then obtained between these two terminals. This electric resonance can be used as a base for implementing filters or oscillators, for example.

Elastic wave resonators are also known wherein the support for the propagation of the elastic waves is a thin piezoelectric plate, rather than a thick substrate. Such a plate can thus be used as a support for the propagation of so-called "plate" waves, such as Lamb waves. These elastic waves also propagate parallel to the surface of the plate. A plate wave resonator can thus be made, for example by depositing metal electrodes on one of the faces of this plate, to obtain two reflectors such as those mentioned hereinabove.

Surface elastic wave or plate wave resonators typically have resonance frequencies comprised between a few tens of MegaHertz and a few GigaHertz, well suited for many radio wave communication applications (mobile telephony, WiFi, Bluetooth, etc.). In addition, these resonators generally have high quality factors and can be integrated onto small-size electronic chips.

For several types of applications, in particular in the field of radio communications, it is interesting to be able to adjust the resonance frequency of such a resonator at will.

Indeed, due to the vivid development of radio communications, the saturation and encumbrance effects of the radio spectrum tend to multiply, all the more that the frequency bands allocated for such and such a type of protocol are generally fixed. A more agile radio communications management, wherein the communication frequencies used could be modified, would make it possible to resolve this problem in part. Moreover, the latest generation of mobile telephone terminals are now capable of operating on about forty different frequency bands, which requires extremely complex data processing circuits in order to provide for all the cases. Having components the operating frequency of which could be electronically controlled would certainly enable to simplify these architectures.

An elastic surface wave resonator, such as described above, whose resonance frequency can be adjusted, is described in the following article: P. S. Cross et al., "Electronically variable surface-acoustic-wave velocity and tunable SAW resonators", Appl. Phys. Lett. 28, 1 (1976).

This resonator comprises the two reflectors mentioned above, and, between these two reflectors, an input transducer and an output transducer to electrically interface the resonator (this device operating in transmission, with an input port and an output port for the electric signal). The resonator further comprises a frequency tuning transducer, also located between the two reflectors and, comprising two metal electrodes forming two interdigital combs (i.e.: interdigitated combs). A variable capacitor is connected between these two electrodes. The resonance frequency of the device (electrical resonance frequency, corresponding here to a maximum of transmission) can then be adjusted by varying the capacitance of this capacitor.

The variation in the resonance frequency of the device, as a function of the electric capacitance connected between these two electrodes, can be explained by noting that an elastic surface wave, that propagates at the surface of a piezoelectric material, has an electrical component. Imposing specific conditions on the electric field, at the surface of this material, thus influences the propagation of these elastic waves, this effect being generally called acousto-electric effect.

Thus, when the surface of the material is entirely metallised, for example, a slower propagation speed is obtained than when this surface is left free electrically (i.e. with no constraints, for the electric field). The capacitor mentioned hereinabove, the impedance of which can be adjusted, then enables, in the zone occupied by the tuning transducer, to adjust the effective speed of the elastic waves, between their speed in a short-circuit condition and their speed in an open-circuit condition, which makes it possible to modify the resonance frequency of the resonator.

However, with the device described in this article, the range over which the resonance frequency can be adjusted remains limited (this range has a width that is about 0.1% of the resonance frequency).

SUMMARY

In order to obtain a more extended adjustment range, a possibility is to increase the number of fingers (or, in other terms, the number of teeth) of the interdigitated electrodes of the frequency tuning transducer (while keeping the same period between teeth). In the resonator, this increases the length of the zone occupied by the tuning transducer, and therefore the length over which the propagation speed is modified. The results of digital simulations shown in FIG. 2 (which will be described in detail hereinafter) confirm that the width of the range of tunability effectively increases when the number of fingers $N_2$ of the interdigitated electrodes of the frequency tuning transducer $T_T$ increases.

Increasing this number of fingers N2 (and also, possibly, the number of fingers N1 of the interfacing transducer $T_I$ that is used to electrically interface the resonator), enables furthermore to obtain an impedance that is quite close to 50 Ohms, for all of these transducers.

The inventors have however observed that the increase in the number of fingers N2 leads to undesirable effects. In particular, when N2 increases, a fixed-frequency parasitic resonance (marked with the reference sign Rp, in FIG. 2) becomes increasingly pronounced. This effect can be explained by an increase in the reflection coefficient for the acoustic waves at the interface between the interfacing transducer $T_I$ and the tuning transducer $T_T$, when N2 increases. This stronger reflection at this interface then tends to favour a resonance mode located on only a portion of the resonator, between the reflector R1 and the interface $T_I/T_T$ (mode which is therefore mainly located on the interfacing transducer $T_I$). This parasitic effect can be particularly inconvenient. For example, for the curves that correspond to the case N1=11 and N2=31, it can be seen in FIG. 2 that this parasitic resonance Rp has an amplitude that is as large as the "main" adjustable frequency resonance (at least for small capacitance values).

In this context, an electromechanical device is proposed, comprising an elastic wave resonator that, remarkably, includes several interfacing transducers, with interdigitated electrodes, as well as several frequency tuning transducers, also with interdigitated electrodes, these different transducers being positioned along a propagation path of the elastic waves by alternating interfacing transducers, and tuning transducers, along this path.

Thus rather than using a single interfacing transducer comprising a large number of fingers, and, after it, a single frequency tuning transducer (connected to an external adjustable impedance) comprising also a large number of fingers arranged one after the other, a multitude of interfacing transducers and a multitude of tuning transducers, each comprising a limited number of fingers, alternating with one another along the propagation path of the elastic waves, are used here.

This makes it possible to distribute the electrodes that control the propagation speed over the entire length of the resonator (in order to obtain a wide adjusting range for the resonance frequency), and this also makes it possible to use a substantial total number of fingers (in order to obtain an impedance close to 50 Ohms, for example), while still limiting the appearance of parasitic resonant modes that would be located over only a portion of the resonator.

In other terms, a global resonance mode, distributed over the entire resonator, is thus favoured.

The improvement made possible by this particular arrangement is illustrated, for an exemplary embodiment, in FIG. 3. This figure shows electrical resonance curves obtained for a device similar to the one of FIGS. 1 and 2, but comprising three interfacing transducers and three frequency tuning transducers, alternating with one another along the propagation path of the elastic waves. As can be seen in this figure, this configuration with alternating transducers makes it possible to obtain a main resonance, with an adjustable frequency, the amplitude of which is clearly higher than that of the parasitic resonance mentioned hereinabove.

The present technology relates more precisely to an electromechanical device having an adjustable resonance frequency, comprising:
  a piezoelectric support delimited by a surface, or by two surfaces parallel to each other, and
  on this support, a resonator for elastic waves propagating parallel to the surface or surfaces, the resonator comprising at least:
    two reflectors that delimit the resonator and which are reflective for the waves, and
    between the two reflectors, several interfacing transducers configured to generate the waves from an electrical signal, and
    several transducers for controlling the resonance frequency,
    each of the transducers comprising a first electrode and a second electrode that are interdigitated, each extending on the surface, or on one of the surfaces of the piezoelectric support, and
  an electrical device for controlling the resonance frequency, this electrical device comprising a first terminal and a second terminal and having between these two terminals an adjustable electrical impedance,
  and wherein, for each tuning transducer, the first electrode and the second electrode of the transducer are respectively connected to the first terminal and to the second terminal of the electrical control device,
  the first electrodes of the different interfacing transducers are electrically connected to each other, and the second electrodes of the interfacing transducers are also electrically connected to each other, and wherein
  the interfacing transducers and the tuning transducers are positioned along a propagation path followed by the waves in the resonator with an alternation between interfacing transducers and tuning transducers, each tuning transducer being inserted between two successive interfacing transducers, or between one of the reflectors and the adjacent interfacing transducer.

The waves in question can be surface waves propagating at the surface of the support (for example of the Rayleigh wave type), this support then being relatively thick. In this case, the different electrodes of the transducers as well as the reflectors are fabricated on the same surface, corresponding for example to a free surface of the support.

The piezoelectric support can also be in the form of a thin piezoelectric plate delimited by the two surfaces mentioned hereinabove, one upper and the other lower, parallel to each other (in practice, parallel by better than the nearest 10 degrees). In this case, the deformation caused by the propagation of the elastic waves is distributed over the entire thickness of the plate, or at the least over most of its thickness. These elastic waves, for example of the Lamb wave type, are then called plate waves.

When the piezoelectric support is in the form of a thin plate, some electrodes of the transducers can be placed on one of the two surfaces of the plate, the other electrodes being located on the other surface of this plate. Moreover, a support of this type generally makes it possible to obtain an electromechanical coupling that is stronger than a solid (thick) support intended for the propagation of surface waves. The thin plate mentioned hereinabove can be in the form of a suspended membrane, or, in a stack of several layers, in the form of a piezoelectric layer where the elastic waves remain guided.

In one case as in the other (either in the case of surface waves or in the case of plate waves), the support can be of a single piece, formed from the same piezoelectric material, for example a monocrystalline or substantially monocrystalline material (such as quartz, lithium niobate or lithium tantalate). But this support can also be in the form of a stack of layers, with one or more of these layers (but not necessarily all of them) being piezoelectric.

The propagation path is the average line followed by the elastic waves in the resonator. When the resonator comprises exactly two reflectors located facing one another, this propagation path is a segment that extends from one of the reflectors to the other.

In practice, in order to adjust the resonance frequency of the resonator, the adjustable electrical impedance, for example a capacitor with adjustable capacitance, is connected between the first and second electrodes of the frequency tuning transducers, as indicated above. As the resonance frequency of the device is high, the capacitance values used are generally small, of about a picofarad. In this context, the connection of the first electrodes with one another, and the connection of the second electrodes with one another must be particularly meticulous in order to prevent introducing additional parasitic impedances, in particular parasitic capacitances. In particular, a connection between electrodes by means of wires welded on the electrodes (connection of the "wire bonding" type) is generally not optimal, in this context.

Also, in order to limit the appearance of such parasitic impedances, it can be provided that:
- for at least some of the interfacing transducers, even for all of them:
  - the first electrodes of these interfacing transducers are connected to each other by one or more first electrical tracks, and
  - the second electrodes of these interfacing transducers are connected to each other by one or more second electrical tracks, that
- for at least some of the tuning transducers, even for all of them:
  - the first electrodes of these tuning transducers are connected to each other by one or more third electrical tracks, and
  - the second electrodes of these tuning transducers are connected to each other by one or more fourth electrical tracks,
- each of the electrical tracks being made on the surface, or on one of the two surfaces of the piezoelectric support.

It can furthermore be provided that the tracks that are made on the same surface of the piezoelectric support do not overlap with one another.

In this case, the tracks that are on the same surface of the support do not overlap in that they are not superimposed on one another and do not pass one over the other. In other terms, in projection on this surface, they do not cross (i.e. they do not intersect, in projection on this surface). Different features, making it possible to prevent an overlapping between tracks, are presented hereinbelow.

In addition to the features presented hereinabove, the electromechanical device that has just been described can have one or more additional features among the following, taken individually or in any technically permissible combination:
- each of the interdigitated electrodes comprises one or more fingers and a longitudinal conductive strip from which extend the finger or fingers and which form the main body of the electrode;
- for the interfacing transducers:
  - each of the second electrodes comprises at least one more finger than the first electrode with which it is associated, the two peripheral fingers of this second electrode surrounding the complete set of fingers of the first electrode, these two peripheral fingers each having, opposite the main body of the second electrode, an end located on the first side of the propagation path, and
  - each of the second tracks connects the end of one of the peripheral fingers of one of the second electrodes to the end of one of the peripheral fingers of the next second electrode, the main bodies of the second electrodes and their peripheral fingers forming, with the second tracks, a global track that meanders along the propagation path, on either side of the path, by circumventing the tuning transducers;
- for each interfacing transducer, the main body of the second electrode of the transducer is connected to one of the second tracks, not only by one of the peripheral fingers of this second electrode but also by one or more additional fingers that extend transversally with respect to the propagation path, crossing the propagation path and which are located between the interfacing transducer considered and the tuning transducer adjacent to it;
- each of the second tracks forms, with the second electrode of one of the tuning transducers, a same longitudinal conductive strip located on the first side of the propagation path;
- each of the fourth tracks (42) forms, with the second electrode (20) of one of the interfacing transducers (TI) a same longitudinal conductive strip located on the second side of the propagation path;
- the second electrodes of the interfacing transducers are in electrical contact with the second electrodes of the tuning transducers, at least via their peripheral fingers, the main bodies of the second electrodes and their peripheral fingers forming together a same main track that meanders along the propagation path, on either side of the path, by circumventing the first electrodes of the tuning transducers and of the interfacing transducers;
- the first and second electrical tracks are located on a first side of the propagation path of the elastic waves, while the third and fourth electrical tracks are located on a second, opposite side of the propagation path of the elastic waves;
- for the interfacing transducers:
  - the main body of each of the first electrodes is located on the first side of the propagation path, and the main body of each of the second electrodes is located on the second side of the
  - each of the first tracks connects the main body of one of the first electrodes to the main body of the next first electrode;
- the support forms a thin plate, delimited by the two surfaces, parallel to each other; this plate, for example suspended, can be at least partially free to be deformed according to a direction perpendicular to the plate;
- the interfacing transducers and the tuning transducers are made on the same surface of the support;
- the interfacing transducers are on one of the surfaces of the plate while the tuning transducers are on the other surface of the plate;
- the second electrodes of the interfacing transducers are in electrical contact with the second electrodes of the tuning transducers, and:
  - either the first electrodes of the interfacing transducers,
  - or the first electrodes of the tuning transducers,
  - or the second electrodes of the interfacing transducers and of the tuning transducers are on one of the surfaces of the plate, the other electrodes of the interfacing transducers and of the tuning transducers being on the other surface of the plate;

the first and second electrodes each comprise one or more fingers that extend transversally with respect to the propagation path, and wherein, for at least some of the first and second electrodes, even for all of them, the total number of fingers of the electrode is less than or equal to 10, even less than or equal to 5 or 6.

for at least some of the first and second electrodes, even for all of them, the total number of fingers of the electrode is comprised between 1 and 3, even between 1 and 2;

the assembly that groups together the different electrodes of the tuning transducers and of the interfacing transducers comprises a total number of electrode fingers greater than or equal to 40, even greater than or equal to 80, or even greater than 150;

the number of interfacing transducers is greater than or equal to three, even greater than or equal to four or to five;

the number of tuning transducers is greater than or equal to three, even greater than or equal to four or five.

The present technology and its different applications shall be better understood when reading the following description and when examining the accompanying figures.

BRIEF DESCRIPTION OF THE FIGURES

The figures are presented for the purposes of information and are not limiting in any way.

DETAILED DESCRIPTION

Figure 1:
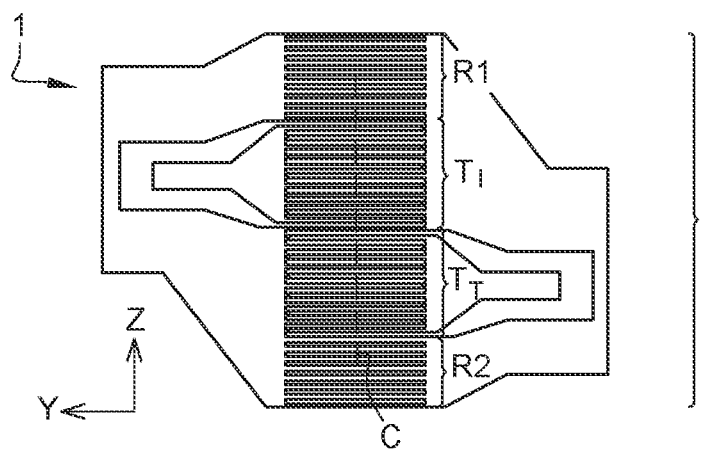
FIG. 1 diagrammatically shows an electromechanical device comprising a frequency-agile surface wave resonator, seen from above. This device is shown for the purposes of comparison, and does not implement the present technology, strictly speaking.

FIG. 1 diagrammatically shows an electromechanical device, 1, comprising an elastic wave resonator 2 which includes a single interfacing transducer $T_I$ and a single resonance frequency tuning transducer, $T_T$. This case is presented for the purposes of comparison, in order to better illustrate the interest of equipping such a resonator with several interfacing transducers and several tuning transducers interleaved with one another along the propagation path C followed by the elastic waves in the resonator.

This device 1 comprises a solid piezoelectric substrate made of Lithium Niobate $LiNbO_3$, as a cross-section X, which serves as a support for the propagation of elastic surface waves that propagate at the surface of this substrate. The resonator 2 can be made by depositing a metal layer (here a layer of Aluminium) on the free surface of the substrate, then by carrying out a lithography and etching of this layer in such a way as to delimit two reflectors R1 and R2, the electrodes of the transducers $T_T$ and $T_I$, as well as the contact zones making it possible to connect the electrodes to external elements, for example to a capacitor with adjustable capacitance (by means of conductor wires welded onto these contact zones, for example).

The two reflectors R1 and R2 each comprise several parallel metal strips, regularly spaced to form a reflective periodic array for the elastic waves in question (a sort of Bragg mirror; the period, i.e. the pitch of this array is typically $\lambda/2$, where $\lambda$ is the wavelength at the expected resonance for this resonator, for example when the tuning transducer is in an open circuit). Seen from above, each one of these reflectors can have the shape of a ladder, with each one of the strips in question forming one of the bars of the ladder. These reflectors are generally formed from two electrodes, electrically connected to one another (short-circuited). They can however also be formed from electrodes left electrically floating (in open-circuit): in this case the reflector takes the form of a network of identical periodicity with metal lines that are not connected together.

The two reflectors are located facing one another. They are located on the same axis, here an axis parallel to the crystallographic axis Z of the substrate. The metal strips of each one of these reflectors are perpendicular to this axis, to the extent that each reflector reflects the elastic waves in the direction of the other reflector. The average direction of propagation of the elastic waves in the resonator 2 is therefore that of the axis Z. The propagation path, C, followed by the elastic waves in the resonator is a segment delimited by the two reflectors R1 and R2, and therefore, here, parallel to the axis Z.

The interfacing transducer $T_I$ and the tuning transducer $T_T$ are both located on the propagation path C, between the two reflectors R1, and R2, and one following the other. These transducers $T_I$ and $T_T$ each include a first electrode and a second electrode that are interdigitated. Each one of these electrodes comprises one or more fingers parallel to each other, and perpendicular to the propagation path C. When the electrode comprises several fingers, the latter are arranged in such a way as to form a comb. Each finger then has the form of a metal strip that has a free end and, opposite, an end through which it is connected to a common longitudinal strip (perpendicular to the fingers), called "bus". The finger or fingers of the first electrode, and those of the second electrode are interleaved with each other. They are arranged, along the propagation path C, by alternating each time one finger from the first electrode then a finger from the second electrode and so on (thus, each finger of the first electrode, except possibly those of the ends of the comb, extends between two fingers of the second electrode).

The total number of fingers of the interfacing transducer $T_I$, equal to the sum of the number of fingers of its first electrode and of the number of fingers of its second electrode, is noted as N1. The total number of fingers of the tuning transducer $T_T$ is noted as N2.

Figure 2:
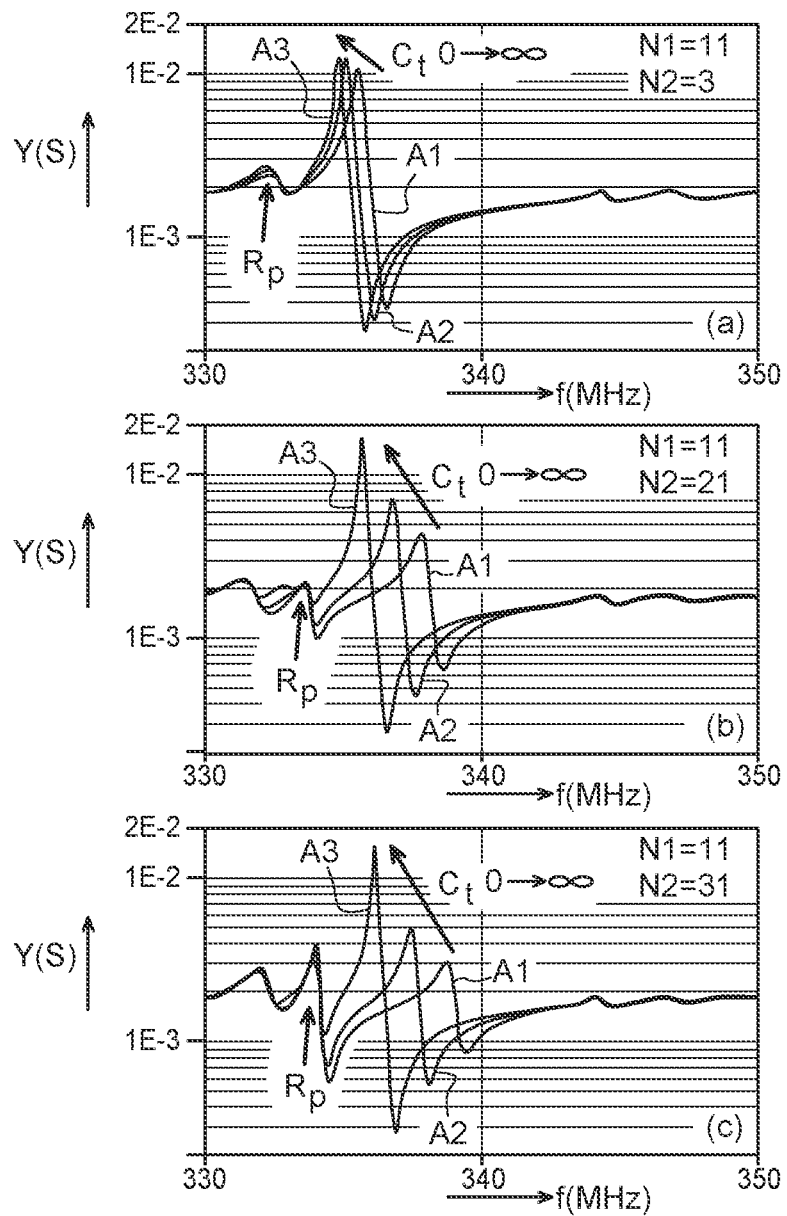
FIG. 2 diagrammatically shows electrical resonance curves of the device of FIG. 1, the number of fingers of the frequency control electrodes varying from one configuration to another, in this figure.

FIG. 2 shows electrical resonance curves of the device 1 of FIG. 1, obtained by digital simulation, for the three following configurations:
  N1=11 and N2=3 (curves (a), in FIG. 2),
  N1=11 and N2=21 (curves (b), in FIG. 2), and
  N1=11 and N2=31 (curves (c), in FIG. 2).

For these three configurations, FIG. 2 shows the admittance Y of the device 1 (the quantity Y is more precisely equal to the module of the admittance in question), between the two electrodes of the interfacing transducer $T_I$ (the admittance Y being expressed in Siemens), according to the frequency f (in MegaHertz), the two electrodes of the tuning transducer $T_T$ being connected to a capacitor Ct with adjustable capacitance.

For each one of these configurations, three curves have been shown, corresponding respectively to three different values of capacitor Ct. FIG. 2, for each configuration (a), (b) and (c), thus shows:
  a first curve A1 corresponding to a very low capacitance value Ct (this situation is practically equivalent to two electrodes in an open circuit, for the tuning transducer $T_T$), curve for which the resonance frequency is the largest,
  a second curve A2 corresponding to an intermediate capacitance value Ct (about 0.3 picofarad, the impedance of the capacitor then being about a kiloOhm), curve for which the resonance frequency is intermediate, and
  a third curve A3 corresponding to a very high capacitance value Ct (this situation is practically equivalent to two electrodes in a short-circuit, for the tuning transducer $T_T$), situation wherein the resonance frequency is the smallest.

As can be seen in this figure (and as already discussed in the "summary" part), increasing the number of fingers N2 of the tuning transducer $T_T$ makes the device 1 more agile: its resonance frequency can be adjusted over a larger range (range of about 1 MHz for N2=3 and a little more than 2.5 MHz for N2=31). But the appearance of a fixed-frequency parasitic resonance $R_P$ is also noted, all the more so marked as N2 is large. For N2=31, for example, in an open circuit situation (curve A1), this parasitic resonance has an amplitude that is as large as the main adjustable frequency resonance, and is therefore particularly inconvenient. As already indicated, this parasitic resonance (which is produced for a frequency of about 334 Megahertz) is associated with a resonance mode located on only a portion of the resonator 2 and which somewhat corresponds to a specific acoustic resonance of the portion occupied by the interfacing transducer $T_I$ (which explains that this parasitic resonance $R_P$ has a fixed frequency, independent of the impedance connected between the electrodes of the tuning transducer $T_T$).

Figure 3:
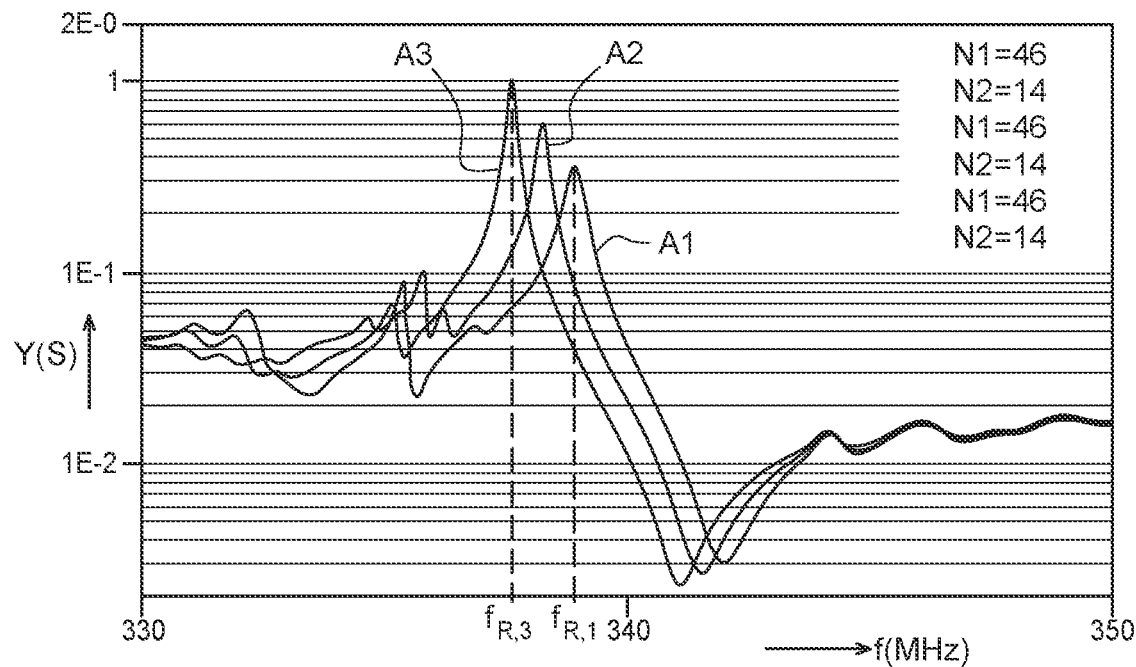
FIG. 3 diagrammatically shows electrical resonance curves of a device similar to the one of FIG. 1, but comprising several interfacing transducers, and several transducers for controlling the resonance frequency alternating with one another along the axis of the resonator.

FIG. 3 shows electrical resonance curves of a device similar to that of FIG. 1, but comprising three interfacing transducers and three frequency tuning transducers, alternating with one another along the propagation path of the elastic waves.

Each one of these transducers comprises a first electrode and a second electrode that are interdigitated, such as described hereinabove. For each interfacing transducer, the total number of fingers of the transducer, N1, is equal to 46, here (this is the sum of the number of fingers of its first electrode and of the number of fingers of its second electrode). And, for each tuning transducer, the total number of fingers of the transducer, N2, is here equal to 14.

The first electrodes of the three tuning transducers are electrically connected together. The second electrodes of the three tuning transducers are also electrically connected together, and a capacitor with adjustable electrical capacitance is connected between these first electrodes on the one hand, and these second electrodes on the other hand.

The first electrodes of the three interfacing transducers are electrically connected together, as well as the second electrodes of these transducers. FIG. 3 shows the admittance Y of the device (in Siemens), between these first electrodes on the one hand, and these second electrodes on the other hand, according to the frequency f (in MegaHertz). Three curves A1, A2 and A3 (here too obtained by digital simulations), corresponding to the three capacitance values mentioned hereinabove (very low capacitance, intermediate capacitance, of about 0.3 picofarad, and very high capacitance), are shown in FIG. 3.

As can be seen in FIG. 3, using several tuning transducers distributed over the entire propagation path and inserted between the interfacing transducers (rather than a single longer tuning transducer, of a single piece), makes it possible to obtain a main adjustable frequency resonance, the amplitude of which is marked and is clearly greater than that of the parasitic resonances that can be observed in this figure. For the curve A1, the frequency for which the resonance is obtained is marked by the reference $f_{R,1}$, in FIG. 3. And for the curve A3, the frequency at which the resonance is obtained is marked by the reference $f_{R,3}$. For each one of these curves, also note that the resonance is particularly well separated from the anti-resonance, which shows a high electromechanical coupling coefficient.

As already explained, such a configuration, wherein interfacing transducer and tuning transducer are alternated, makes it possible to distribute the electrodes that control the propagation speed over the entire resonator (in order to obtain a wide adjusting range for the resonance frequency), and makes it possible, for the complete set of the transducers, to use a rather high total number of fingers (in order to obtain an impedance close to 50 Ohms, for example), while still limiting the appearance of parasitic resonance modes located on only a portion of the resonator.

Moreover, generally, the present technology relates to an electromechanical device 5; 8; 9; 12; 14; 16 having an adjustable resonance frequency, and comprising:
  a support 100; 200, piezoelectric, delimited by a surface S, or by two surfaces S1 and S2 parallel to each other, and on this support 100; 200, a resonator 50; 80; 90; 120; 140 for elastic waves propagating parallel to the surface or surfaces S; S1, S2, the resonator comprising:

two reflectors R1 and R2 that delim it the resonator and which are reflective for the waves, several interfacing transducers $T_I$, and several transducers for controlling $T_T$ the resonance frequency, the interfacing transducers $T_I$ and the tuning transducers $T_T$ being arranged along the propagation path C followed by the waves in the resonator, with, along this propagation path, an alternance between interfacing transducers and tuning transducers.

The interfacing transducers $T_I$ and the tuning transducers $T_T$ are arranged following one another along the propagation path C, with, successively, an interfacing transducer $T_I$, then a tuning transducer $T_T$, then an interfacing transducer $T_I$, and so one. Thus, except for the two transducers ($T_I$ or $T_T$) located at the two ends of the propagation path C, each tuning transducer $T_T$ is located between two interfacing transducers $T_I$ (which are its closest neighbours), and, likewise, each interfacing transducer $T_I$ is located between two tuning transducers $T_T$ (which are its closest neighbours). Regarding the two transducers, $T_I$ or $T_T$, located at the two ends of the propagation path C, they are inserted each between one of the two reflectors R1, R2 on the one hand, and a transducer of another type, $T_T$ or $T_I$, on the other hand.

In addition to the embodiment corresponding to the resonance curves of FIG. 3, six different embodiments of this device 5; 8; 9; 12; 14 and 16 are described here. They are shown respectively in FIGS. 5, 8, 9, 12, 14 and 16.

Figure 4:
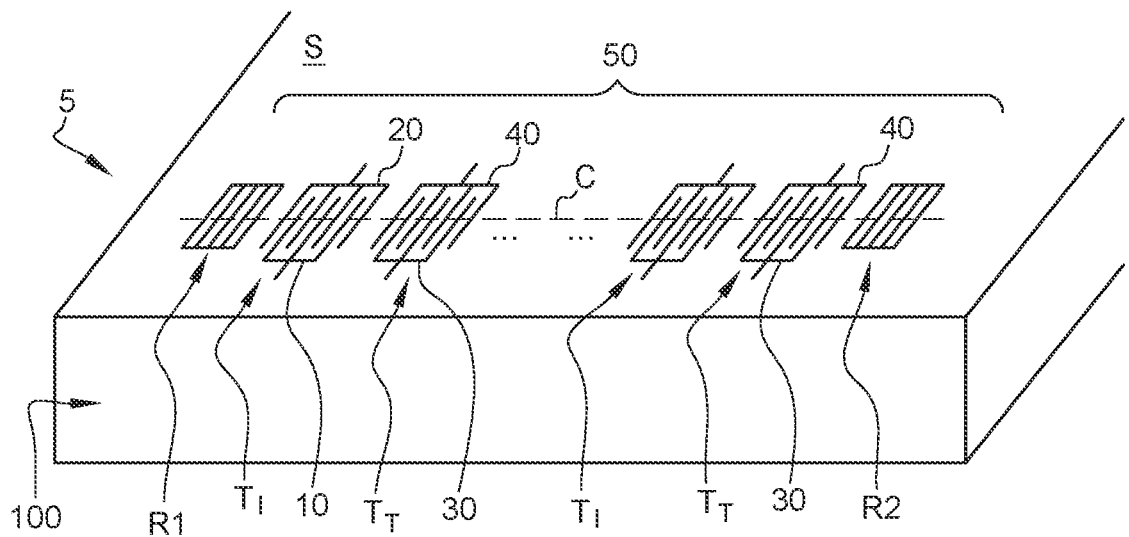
FIG. 4 diagrammatically shows an electromechanical device comprising a frequency-agile surface wave resonator, seen in perspective.
Figure 5:
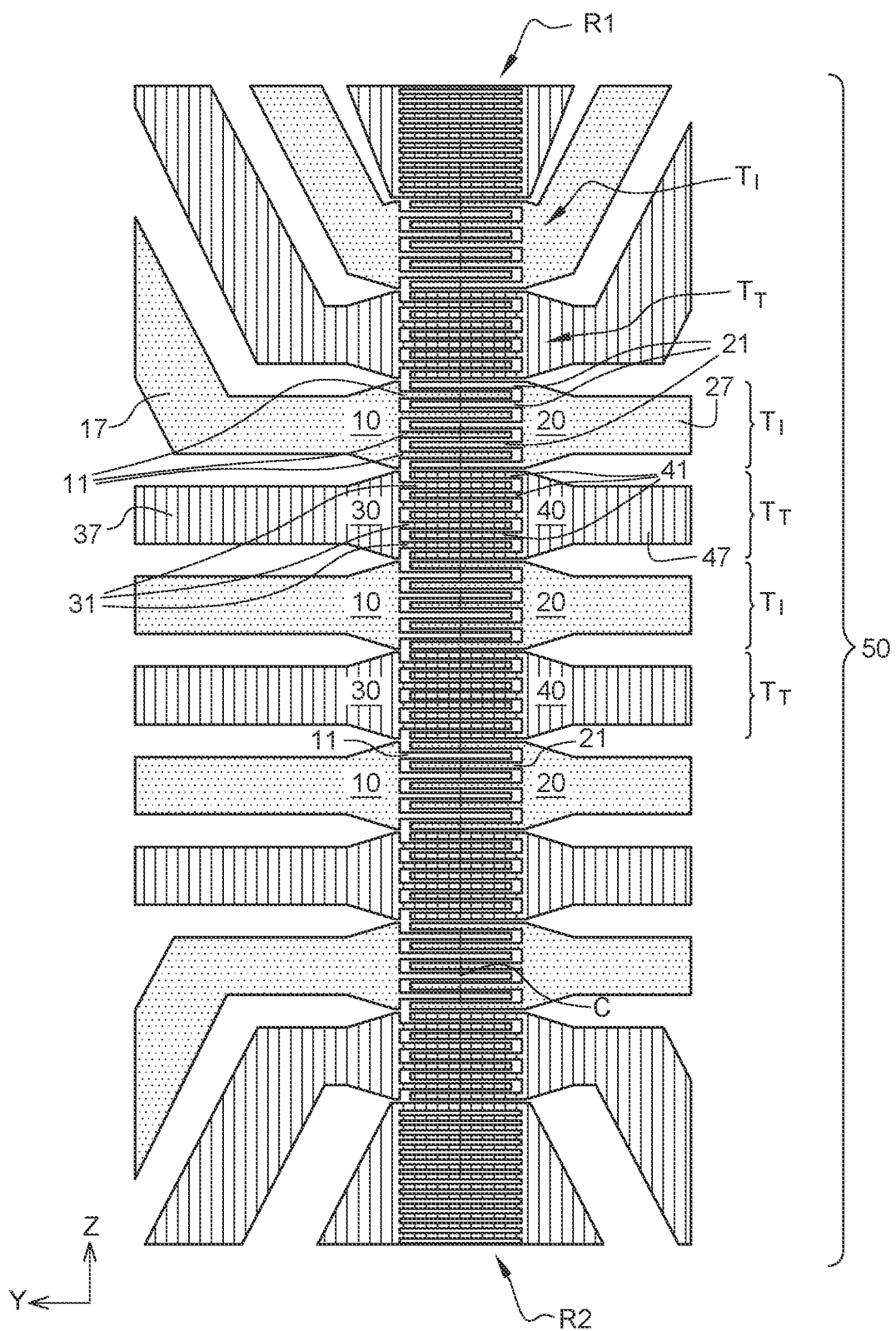
FIG. 5 diagrammatically shows the device of FIG. 4, seen from above.
Figure 8:
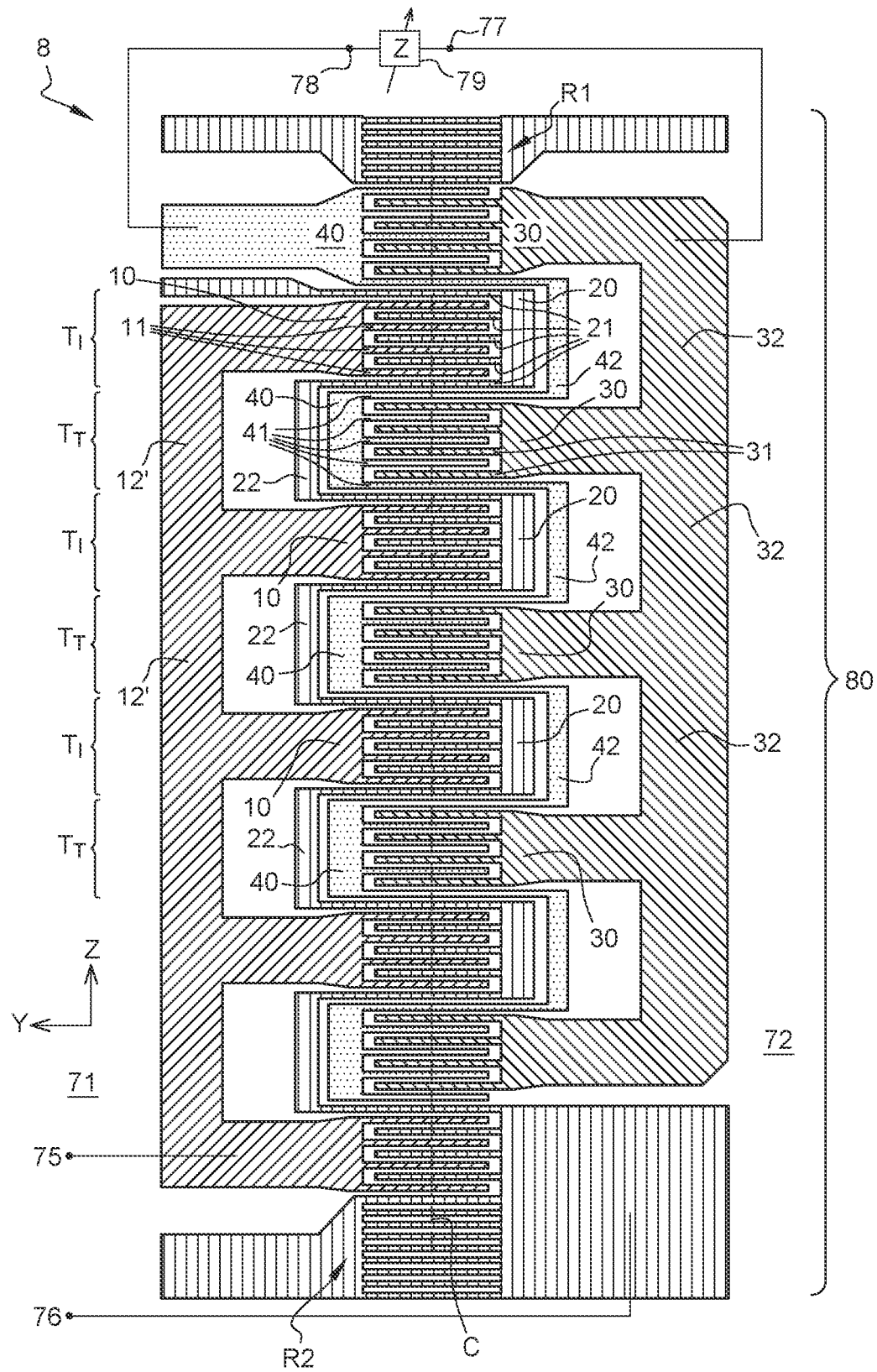
FIG. 8 diagrammatically shows an electromechanical device comprising a frequency-agile surface wave resonator, seen from above.
Figure 9:
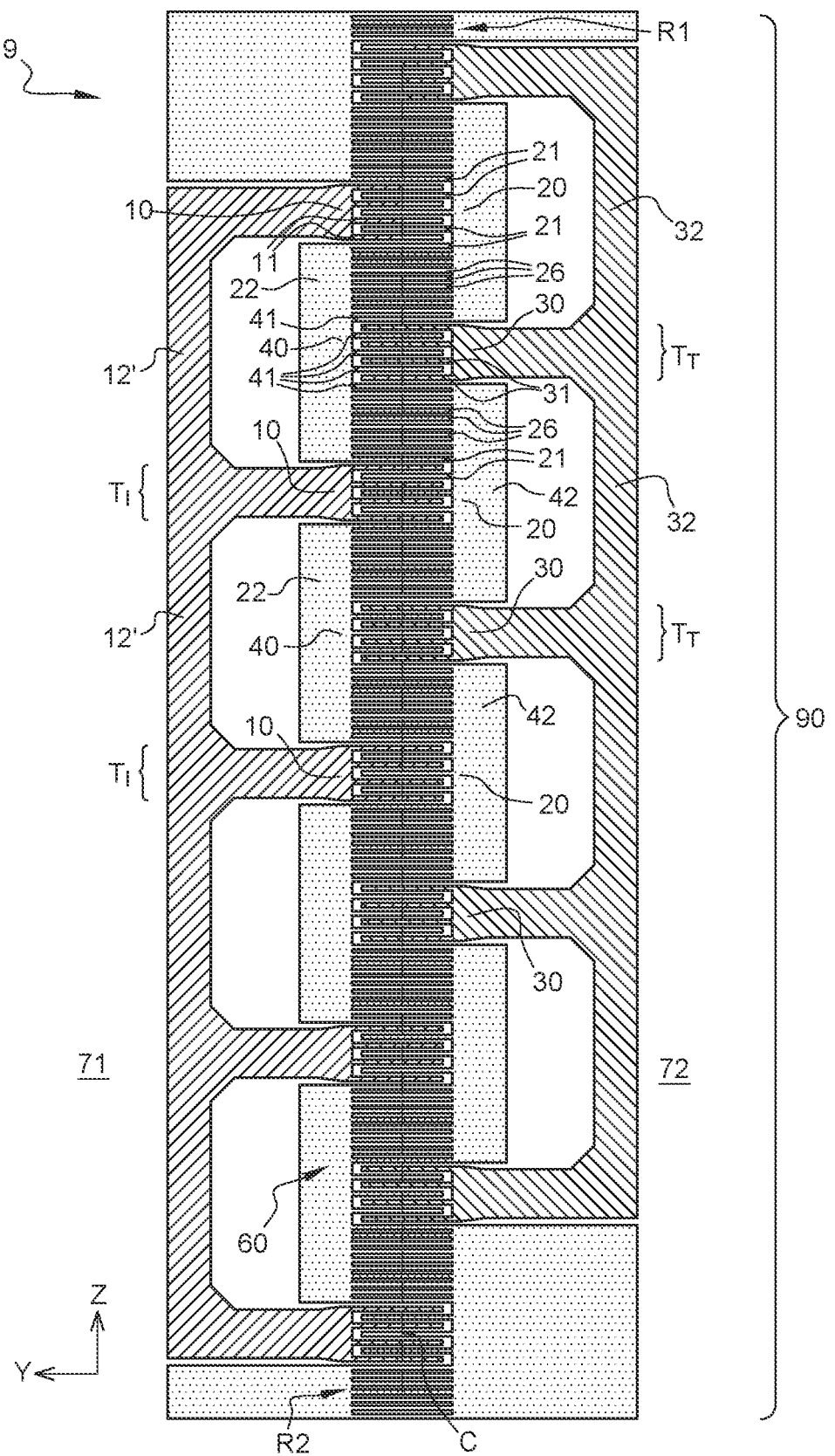
FIG. 9 diagrammatically shows yet another electromechanical device comprising a frequency-agile surface wave resonator, seen from above.

For the embodiments of FIGS. 5, 8 and 9, the support 100 of the device is a solid, thick support, and the resonator 50; 80; 90 is a surface wave resonator, made on the free surface S of this support (see FIG. 4). Here, this surface is planar.

For the three other embodiments, of FIGS. 12, 14 and 16, the support, 200, is a thin piezoelectric plate (see FIG. 11), delimited by the two surfaces S1 and S2 mentioned hereinabove, and the resonator is a plate wave resonator. The two surfaces S1 and S2 are planar, here.

These different embodiments have many points in common. Also, from one embodiment to another, identical or corresponding elements will as much as possible be marked with the same reference signs, and will not necessarily be described each time.

Features that are common to these different embodiments are presented first, before describing each one of these embodiments in more detail, one after the other.

In each one of these embodiments, the resonator comprises exactly two reflectors. These two reflectors R1 and R2 have a similar structure, and even identical to the resonators of FIG. 1: they each comprise several parallel metal strips, regularly spaced in order to form a reflective periodic array for the elastic waves considered. These two reflectors are located facing one another, on the same axis. In the resonator, the elastic waves propagate along this axis, reflecting alternatively on one, then the other of these reflectors R1 and R2. The propagation path, C, followed by the elastic waves in the resonator is a segment delimited by the two reflectors R1 and R2.

Regarding the interfacing transducers $T_I$, they each comprise a first electrode 10 and a second electrode 20 which are interdigitated, each made on the surface S of the support (FIG. 4), or one of the two surfaces S1 or S2 of the support 200, when this support is made in the form of a thin plate.

Likewise, each tuning transducer $T_T$ comprises a first electrode 30 and a second interdigitated electrode 40, each made on the surface S of the support (FIG. 4), or one of the two surfaces S1 or S2 of the support 200.

These electrodes 10, 20, 30, 40 each comprise one or more fingers 11, 21, 31, 41 parallel to each other, and perpendicular to the propagation path C. When the electrode comprises several fingers, the latter are arranged in such a way as to form a comb. Each finger 11, 21, 31, 41 thus forms a metal strip that has a free end and, opposite, an end through which it is connected to a longitudinal strip common to the different fingers of this comb (perpendicular to the fingers), which form the main body of the electrode (main body of the comb), called "bus". The finger or fingers of the first electrode 10, 30 and those of the second electrode 20, 40 are inserted between one another: they are arranged, along the propagation path C, by alternating at each time one finger 11, 31 from the first electrode 10, 30 then a finger 21, 41 from the second electrode 20, 40 and so on.

Figure 15:
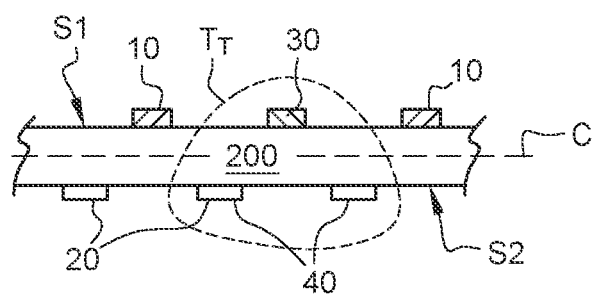
FIG. 15 diagrammatically shows a portion of the device of FIG. 14, seen as a cross-section and side view.
Figure 16:
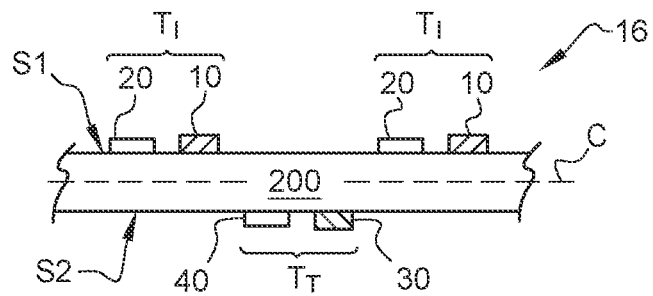
FIG. 16 diagrammatically shows a portion of another electromechanical device comprising a frequency-agile plate wave resonator, seen as a cross-section and side view.

Note that the first and second electrodes of the same transducer can each comprise a single finger, in certain cases (case with the device of FIG. 16, for example). Moreover, the first and second electrodes of the same transducer can be made on two different surfaces of the support 200 (see FIG. 15, for example).

The criteria that lead to choosing a more or less high number of fingers per electrode are discussed hereinbelow, after the description of the figures themselves.

The electromechanical device 5; 8; 9; 12; 14; 16 is configured in such a way that each interfacing transducer $T_I$ can be electrically supplied, or electrically connected to an element external to the device, independently of the tuning transducers $T_T$. As for the tuning transducers $T_T$, they are connected (independently of the interfacing transducers) to an electrical device 79 with an adjustable electrical impedance, that belongs to the electromechanical device 5; 8; 9; 12; 14; 16.

Thus, for each interfacing transducer $T_I$, at least one of the two electrodes of the transducer is electrically isolated with regards to the different electrodes of the tuning transducers $T_T$ (in order to be able to supply/connect this transducer $T_I$ independently of the tuning transducers $T_T$). Likewise, for each tuning transducer $T_T$, at least one of the two electrodes of the transducer is electrically isolated with regards to the different electrodes of the interfacing transducers $T_I$.

In the embodiments described here, the first electrodes 10 of the different interfacing transducers $T_I$ are electrically connected to each other (i.e. connected directly, by an electrical conductor, without an intermediate electrical component). The first electrodes 10 are electrically connected to a first connection terminal of the electromechanical device, 75 (see FIG. 8, for example). The second electrodes 20 of the different interfacing transducers $T_I$ are also electrically connected to one another. They are electrically connected to a second connection terminal of the electromechanical device, 76. The two terminals 75 and 76 make it possible to connect the electromechanical device to an external element. They make it possible for example to connect the electromechanical device (which is used as a tunable electric resonator) in a complete electronic circuit, for example a frequency-agile filtering circuit, or a signal generating circuit, with adjustable frequency. In practice, the two connection terminals 75 and 76 can directly correspond to two wide electrical tracks, or to two "pad" connection zones made on the surface S, or on one of the surfaces S1, S2 of the support 100; 200.

The first electrodes 30 of the different tuning transducers $T_T$ are also electrically connected to each other. They are connected to a first terminal 77 of the device 79 with adjustable impedance Z (see FIG. 8, for example). The second electrodes 40 of the different tuning transducers $T_T$ are also electrically connected to one another. They are electrically connected to a second terminal 78 of the device 79. The device 79 has, between its terminals 77 and 78, an adjustable electrical impedance Z (for example pilotable electrically). From an electrical standpoint, the device 79 can in particular be equivalent to a capacitor with adjustable electrical capacitance (it can moreover be a capacitor with adjustable capacitance).

Note that, in certain embodiments (embodiments of FIGS. 9 and 12, for example), with a common electrical ground, the second electrodes 40 of the tuning transducers $T_T$ are electrically connected to the second electrodes 20 of the interfacing transducers $T_I$ (the electrodes 40 and 20 are short-circuited with one another). The first electrodes 30 of the tuning transducers $T_T$ remain however electrically isolated from the first electrodes 10 of the interfacing transducers $T_I$, in this case.

Surface Wave Resonators

The first three embodiments of the electromechanical device 5; 8; 9, wherein the resonator is a surface wave resonator, are described now in more detail.

As already indicated, in these three embodiments, the support 100 is a solid, thick support (the thickness of which is for example greater than or equal to 6 times the wavelength of the acoustic wave used at the working frequency, i.e. greater than or equal to 12 times the period of the electrodes used in the electromechanical device). Here, the support 100 is made of Lithium Niobate $LiNbO_3$, as a cross-section X (i.e. the free surface S is orthogonal to the crystallographic axis X). Moreover, the axis of the resonator, i.e. the axis of propagation of the elastic waves, in the resonator, is parallel to the crystallographic axis Z (in other words, the propagation path C is parallel to the axis Z).

The reflectors R1, R2 and the electrodes 10, 20, 30, 40 of the different transducers $T_T$, $T_I$ are made from a conductive material, for example a metal material. Here, they are made of aluminium. Their thickness (extension perpendicular to the surface S) is typically comprised between 0.02 and 1.5 microns; Here, for example, it is 0.7 microns. The transducers and the reflectors are made with a metallisation ratio comprised for example between 20 and 60%. Here, for example, the metallisation ratio is 50%. The metallisation ratio is equal to:

the width of any of the interdigitated electrode fingers 11, 21, 31, 41 (i.e. the extension of the finger, parallel to the propagation path C), divided by the pitch (spatial period) between two successive fingers.

Here, for example, each finger has a width of 2.5 microns, and the space left free between two successive fingers also has a width of 2.5 microns (metallisation ratio of 50%). The pitch in question is therefore equal to 5 microns. And the spatial period between two successive finger of the same electrode is 10 microns.

In the first embodiment, shown in FIGS. 4 and 5, the resonator 50 of the electromechanical device 5 comprises five interfacing transducers $T_I$ and five frequency tuning transducers $T_T$. For each interfacing transducer $T_I$, the first electrode 10 of the transducer comprises four fingers, 11, while the second electrodes 20 comprises five fingers, 21. Likewise, for each tuning transducer $T_T$, the first electrode 30 of the transducer comprises four fingers 31, while the second electrode 40 comprises five fingers, 41. All the transducers thus comprises 90 fingers, regularly (periodically) distributed along the propagation path C of the elastic waves.

Each one of the electrodes 10, 20, 30 and 40 is extended, opposite the interdigitated fingers, by a relatively wide electrical track 17, 27, 37, 47, (about thirty microns wide, and about a hundred microns long, or more) intended for the electrical connecting of the electrodes. In this embodiment, the electrical connections between electrodes are made by "bridging", i.e. by welding an electric wire in order to connect the two electrodes to be electrically connected together (connection called "wire bonding"). Thus, the first electrodes 10, for example, are connected to one another by these welded wires (and the same applies for electrodes 20, or electrodes 30 or 40).

Figure 6:
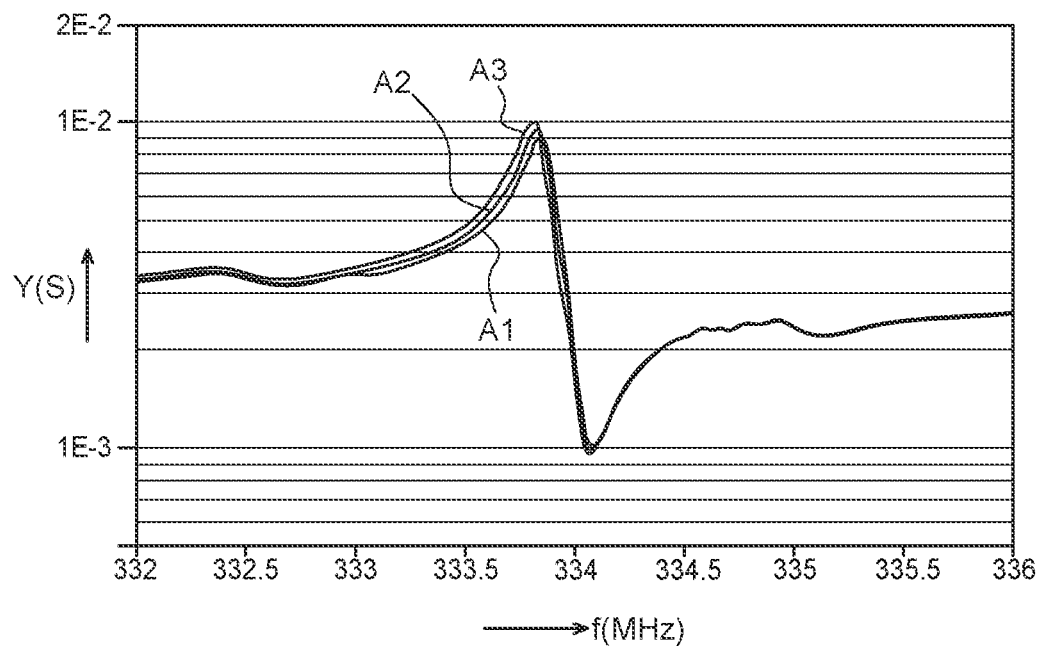
FIG. 6 diagrammatically shows electrical resonance curves of the device of FIG. 4.

FIG. 6 shows three resonance curves A1, A2 and A3 obtained by measuring the admittance Y presented by the electromechanical device 5 between its first connection terminal (connected to the first electrodes 10) and its second connection terminal (connected to the second electrodes 20). The curve A3 is obtained by short-circuiting the first electrodes 30 with the second electrodes 40, for the tuning transducers $T_T$ (which is equivalent, from an electrical standpoint, to connecting a capacitor with an extremely high capacitance between these electrodes). The curve A2 is obtained by connecting a 0.3 picofarad capacitor between the first electrodes 30 and the second electrodes 40. And the curve A1 is obtained in an open circuit, i.e. without connecting an electrical component between the first electrodes 30 and the second electrodes 40 (which is equivalent, from an electrical standpoint, to a capacitor with an extremely low capacitance connected between these electrodes).

As can be seen in FIG. 6, the electromechanical device 5 has a clean electric resonance, without parasitic resonances. Its resonance frequency can effectively be modified by varying the capacitance of a capacitor connected to the terminals of the frequency tuning transducers, $T_T$. But the frequency variation obtained is low, of about a hundred kHz. In addition, the difference between resonance and antiresonance is lower than what could be expected in light of digital simulations (FIG. 3, for example).

This limited tunability is attributed to undesirable effects related to the wired connection (by "bridging"), in particular the introduction of parasitic capacitances or inductances of fixed values.

Also, in the other embodiments, the electrical connections between the electrodes of the electromechanical device 8; 9; 12; 14; 16 are made my means of electrical tracks made on the surface S of the support 100, or on one of the surfaces S1, S2 of the support 200, as shown in FIG. 8, for example. In practice, this effectively makes it possible to obtain a wider range of tunability than with connections via "bridging" (see the experimental curves in FIG. 7, for example).

Particular arrangements are then implemented in order to prevent an overlapping between the electrical tracks which are made on the same surface of the support (overlapping which, again, would be a source of parasitic capacitances and/or inductances), as described now in reference to FIGS. 8 and 9.

The second and third embodiments are shown respectively in FIGS. 8 and 9.

In these two embodiments, in order to prevent an overlapping between electrical tracks:

the electrical tracks that connect the electrodes of the interfacing transducers $T_I$ are made on a first side, 71, of the propagation path C, while the electrical tracks that connect the electrodes of the tuning transducers $T_T$ are made on the other side of the propagation path (on a second side, 72, of this propagation path).

In order to make these connections either on one side, or on the other of the propagation path C (so as to prevent a crossing or an overlapping between tracks), particular arrangements are employed: some electrodes are connected to one another not by their main body (as is the case for the electrodes 10, for example), but, in an innovative manner, by the end of their peripheral fingers 21 (electrodes 20, for example), which have the advantage of being located on the suitable side of the propagation path.

The first side 71 of the propagation path designates the portion of the surface S (or, more generally the zone of the space) located on one side of the propagation path C, for example to the left of the latter. The second side 72 of the propagation path designates the portion of the surface S (or, more generally the zone of the space) located on the other side of the propagation path C, for example to the right of the latter. As already indicated, the propagation path C, which corresponds to the average propagation path followed by the elastic waves in the resonator, is a segment, that extends from the reflector R1 to the reflector R2. This segment passes approximately at the middle of each finger of the interdigitated electrodes (it coincides with the axis of the resonator). Each finger of the interdigitated electrodes extends from one side to the other of the propagation path C (i.e. crosses the path C).

For each interfacing transducer $T_I$, the fingers 11 of the first electrode 10 of the transducer are connected to one another on the first side, 71, of the propagation path C. In other terms, the common longitudinal, conductive strip to which these different fingers 11 are connected to (strip which is perpendicular to the fingers), which forms the body of the electrode 10 in the shape of a comb (main body of the electrode, in a manner of speaking), is located on the first side, 71, of the propagation path C.

The first electrodes 10 are connected to each other by first electrical tracks, 12, located entirely on the first side 71 of the propagation path C. For each pair of neighbouring first electrodes 10 (i.e. which immediately follow along the propagation path, with a single tuning transducer $T_T$ inserted between them), the respective bodies of the two electrodes 10 are connected to each other by one of the first tracks 12'. The assembly of the first electrodes 10 and of the first tracks 12' has a general comb shape (a large-scale comb, in a manner of speaking), each tooth of which corresponds to one of the electrodes 10 (itself formed of several fingers 11). The body of this comb is located on the first side 71 of the path C.

For each interfacing transducer $T_I$, the fingers 21 of the second electrode 20 of the transducer are connected to one another on the second side, 72, of the propagation path C (opposite first tracks 12'): the body of this electrode in the form of a comb is located on the second side of the path C. This second electrode 20 comprises one more finger than the first electrode 10 with which it is associated (i.e. than the first electrode 10 between the fingers 11 of which the fingers 21 of this second electrode 20 are inserted). The two peripheral fingers 21 of this electrode 20 surround, are located on either side (in a manner of speaking enclose) the complete set of fingers 11 of the first electrode 10. The two peripheral fingers 21 of the electrode 20 considered are the two fingers of this electrode that are the farthest apart from each other (while still having as a closest neighbour one of the fingers 11 of the first electrode 10 of the transducer considered). These two peripheral fingers 21 each have a first end, via which they are connected to the body of the electrode 20, and a second opposite end, located on the first side 71 of the propagation path C.

For each pair of neighbouring second electrodes 20 (i.e. which follow one another along the propagation path), the two electrodes 20 in question are connected to each other by a second track 22. This second track extends entirely on the first side 71 of the propagation path. It connects:

the second end of one of the peripheral fingers 21 of one of these two electrodes 20 (here, the peripheral finger of this electrode which is the closest to the other electrode 20 of the pair considered), to the second end of one of the peripheral fingers 21 of the other electrode 20 of the pair considered (here, the peripheral finger of this electrode which is the closest to the other electrode 20 of the pair considered).

Thus, instead of connecting the body of one of the two electrodes 20 to the body of the other electrode 20 of the pair considered (as is the case for the first electrodes 10, for example), these two electrodes 20 are connected by their respective peripheral fingers 21, more precisely by the second end of these peripheral fingers 21, which has the advantage of being located on the first side 71 of the propagation path C. Thus, even if the bodies of the second electrodes 20 are located on the second side of the path C, these electrodes can be connected by passing only on the first side 71 of this path, thus leaving the second side 72 of the propagation path free for the connection of the electrodes of the tuning transducers $T_T$.

The assembly comprising the track 22 and the two peripheral fingers 21 that it connects forms a sort of track in the shape of a C, which, in order to circumvent the tuning transducer $T_T$ located between the two electrodes 20, crosses the path C (in order to pass from the second side to the first side of the propagation path, is then extended parallel to the path C (and on the first side of this path), then, after having exceeded the tuning transducer $T_T$ in question, again crosses the path C to pass back to the second side 72 so as to be connected to the body of the other electrode 20.

The ensemble comprising the second tracks 22, the bodies of the second electrodes 20 and the two peripheral fingers 21 of each one of these electrodes 20 forms a main track that meanders along the path C, crossing and recrossing this path several times to form meanders so as to circumvent the tuning transducers $T_T$ inserted between the interfacing transducers $T_I$ (see FIG. 8, for example).

The tracks 32, 42 that connect the electrodes 30, 40 of the tuning transducers $T_T$ are made in a manner comparable to the tracks 12, 22, but on the second side 72 of the propagation path.

Thus, for each tuning transducer $T_T$, the fingers 31 of the first electrode 30 of the transducer are connected to each other on the second side 72 of the propagation path C. The body of the electrode 30 is thus located on the second side 72 of this path. For each pair of neighbouring second electrodes 30, the two electrodes in question are connected to one another by a third track 32, located entirely on the second side 72 of the path C. The assembly of the first electrodes 30 and of the third tracks 32 has a global comb shape of which each tooth corresponds to one of the electrodes 30 (a large-scale comb, in a manner of speaking), the body of this comb being located on the second side 72 of the path C.

Moreover, for each tuning transducer $T_T$, the fingers 41 of the second electrode 40 of the transducer are connected to one another on the first side 71 of the propagation path C, the body of this electrode thus being located on the first side of the path C. This second electrode 40 comprises one more finger than the first electrode 30 with which it is associated. The two peripheral fingers 41 of this electrode 40 surround all the fingers 31 of the first electrode 30. These two peripheral fingers 41 each have a first end, via which they are connected to the body of the electrode 40, and a second opposite end, located on the second side 72 of the propagation path C.

For each pair of neighbouring second electrodes 40 (i.e. which follow each other, along the propagation path), the two electrodes 40 in question are connected to one another by a fourth track 42. This fourth track extends entirely on the second side 72 of the propagation path. It connects:

- the second end of one of the peripheral fingers 41 of one of these two electrodes 40 (here, the peripheral finger of this electrode which is the closest to the other electrode 40 of the pair considered), to
- the second end of one of the peripheral fingers 41 of the other electrode 40 of the pair considered (here, the peripheral finger of this electrode which is the closest to the other electrode 40 of the pair considered).

Here too, the assembly comprising the four tracks 42, the bodies of the second electrodes 40 and the two peripheral fingers 41 of each one of these electrodes 40 forms a main track that meanders along the path C, crossing and recrossing this path several times to form meanders so as to circumvent the interfacing transducers $T_I$ inserted between the tuning transducers $T_T$.

In the embodiment of FIG. 8 (and contrary to the embodiment of FIG. 9), the second electrodes 20 of the interfacing transducers $T_I$ remain electrically isolated from the second electrodes 40 of the tuning transducers $T_T$.

Such as shown, the resonator 80 of the device 8 comprises five interfacing transducers $T_I$ and five frequency tuning transducers $T_T$. For each interfacing transducer $T_I$, the first electrode 10 of the transducer comprises four fingers, 11, while the second electrode 20 comprises five fingers, 21. Likewise, for each tuning transducer $T_T$, the first electrode 30 of the transducer comprises four fingers 31, while the second electrode 40 comprises five fingers, 41. All the transducers thus comprise 90 fingers, regularly distributed (periodically) along the propagation path C of the elastic waves.

Figure 7:
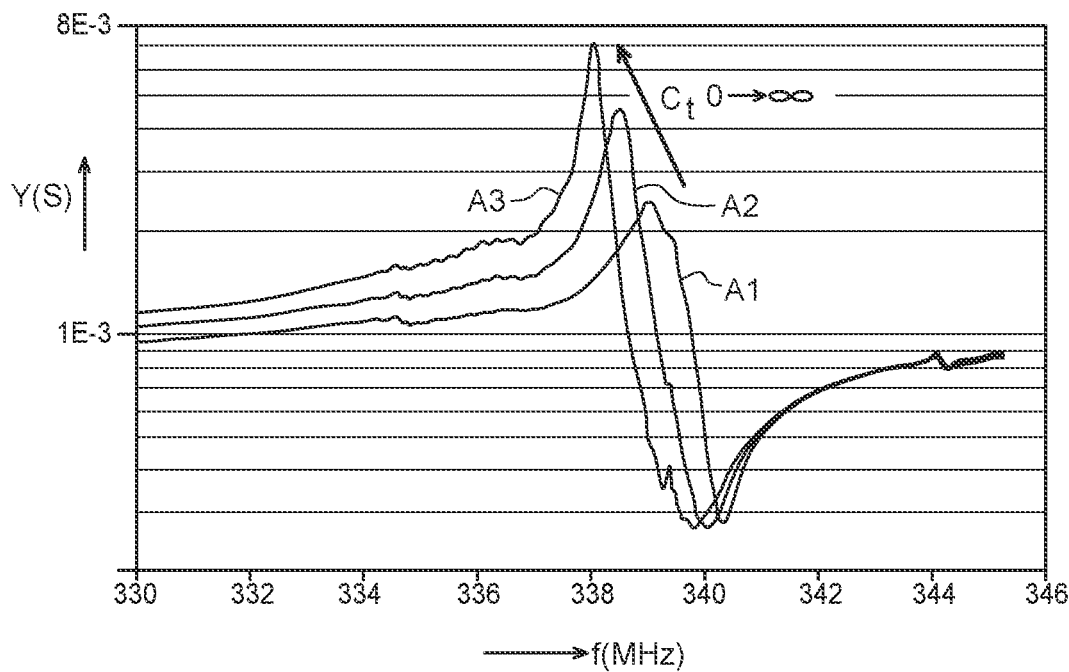
FIG. 7 diagrammatically shows electrical resonance curves of another frequency-agile electromechanical device comprising a surface wave resonator, which is shown in FIG. 8.

FIG. 7 shows three resonance curves A1, A2 and A3 obtained by measuring the admittance Y (expressed in Siemens) presented by the electromechanical device 8 between its first connection terminal 75 and its second connection terminal 76, according to the frequency f (expressed in MegaHertz). The curve A3 is obtained by short-circuiting the first electrodes 30 with the second electrodes 40, for the tuning transducers $T_T$ (Z=0). The curve A1 is obtained on the contrary in an open circuit (infinite Z), and the curve A2 is obtained by connecting an intermediate capacitor of 1 picofarad, between the first electrodes 30 and the second electrodes 40.

As can be seen in FIG. 7, the electromechanical device 8 has a clean electric resonance, without parasitic resonances, with a range of tunability (of about 1 MHz) that is clearly more extended than for the device 5, and with a resonance that is better separated from the anti-resonance (about 1.8 MHz in different), which shows the interest of the particular connection mode used in this case (connection via tracks, and without overlapping).

In the electromechanical device 8 of FIG. 8, each second electrode 20 is connected to one of the second tracks 22 by one of its peripheral fingers 21. Alternatively, it could be provided that each second electrode 20 be connected to one of the second tracks 22 not only by one of its peripheral fingers 21, but also by one or more additional fingers extending transversally with respect to the propagation path, crossing the propagation path C and located between the interfacing transducer $T_I$ considered and the adjacent tuning transducer $T_T$ (as in the case of FIG. 9). Likewise, each second electrode 40 could be connected to one of the fourth tracks 42, not only by one of its peripheral fingers 41 but also by one or more such additional fingers. Thus connecting the second electrode 20 to the second track 22 (or one of the second electrodes 40 and one of the fourth tracks 42) by several fingers instead of only one makes it possible to reduce the electrical resistance, and the inductance between two successive second electrodes 20. In other terms, this makes it possible to better transfer the common electrical potential from one of the second electrodes 20 (or 40) to the next one. However, when several such "electric potential transfer" fingers are inserted between an interfacing transducer $T_I$ and a neighbouring tuning transducer $T_T$, this reverts, from an acoustic standpoint, to inserting a partial reflector between these two transducers $T_I$ and $T_T$. This then contributes in isolating two adjacent sections of the resonator, and can consequently result in a reduction in the electromechanical coupling coefficient of the device, and an increase in the contribution of the specific resonance of the sections of transducers (modes located on only a portion of the resonator).

It is therefore desirable to find a compromise between a reduction in the electrical contacting resistance and inductance (which encourages increasing the number of electric potential transfer fingers) on the one hand, and a reduction in the reflection coefficient between successive transducers on the other hand (which encourages limiting the number of electric potential transfer fingers). Digital simulation results show that it is desirable that the total number of electric potential transfer fingers (including the peripheral fingers 21, 41 of the second electrodes themselves) be comprised between 1 and 10, even between 1 and 4.

The embodiment of FIG. 9 is comparable to the embodiment of FIG. 8, but the second electrodes 20 of the interfacing transducers $T_I$ and the second electrodes 40 of the tuning transducers $T_T$ are electrically connected together (short-circuited) to form a common electrical ground.

Moreover, in this embodiment each one of the second tracks 22 forms, with the second electrode 40 of one of the tuning transducers $T_T$, a same longitudinal conductive strip, located on the first side 71 of the propagation path C. In other terms, this second track 22 and this second electrode 40 are confounded with one another (see FIG. 9).

Likewise, each one of the fourth tracks 42 forms, with the second electrode 20 of one of the interfacing transducers $T_I$, a same longitudinal conductive strip, located this time on the second side 72 of the propagation path.

For each pair comprising one of the interfacing transducers $T_I$, and one of the adjacent tuning transducers $T_T$ of this interfacing transducer (the closest neighbour of this interfacing transducer): the second electrode 20 of the interfacing transducer $T_I$ is in electrical contact with the second electrode 40 of the tuning transducer $T_T$ via their respective peripheral fingers, 21 and 41, and also, here, via additional fingers 26, inserted between these two transducers, $T_I$ and $T_T$ (more precisely, inserted between the peripheral fingers in question, 21 and 41). Each one of these additional fingers 26 extends transversally with respect to the propagation path C, crossing it in order to connect the second electrode 20 to the second electrode 40.

In the example of FIG. 9, for each pair comprising one of the interfacing transducers $T_I$, and one of the adjacent tuning transducers $T_T$ of this interfacing transducer, all the electric potential transfer fingers, located between these two transducers, i.e. the two peripheral fingers 21 and 41, and the additional fingers 26, comprise a total of ten fingers (i.e. eight additional fingers 26). A different number of electric potential transfer fingers, for example smaller, could however be chosen, alternatively.

In the resonator 90 of FIG. 9, the main bodies of the second electrodes 20 and 40, their peripheral fingers, 21 and 41, and the additional fingers 26 mentioned hereinabove together form a same main track 60 that meanders along the propagation path C, on either side of this path (crossing and recrossing the propagation path several times), by forming meanders that make it possible to circumvent the first electrodes 10 and 30 of the tuning transducers $T_T$ and of the interfacing transducers $T_I$.

Figure 10:
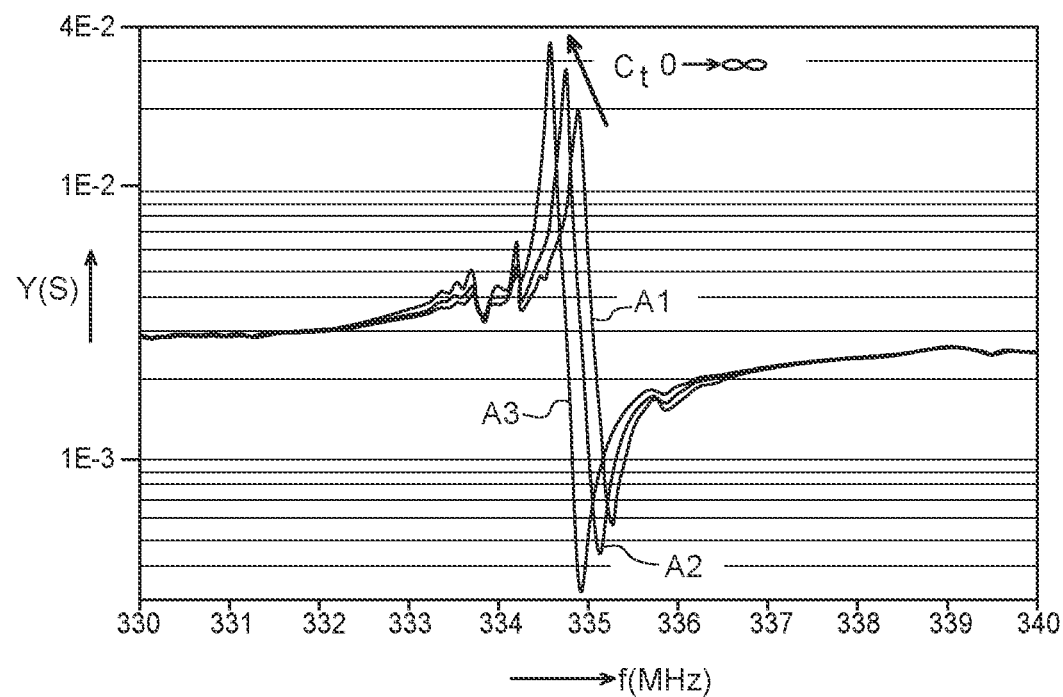
FIG. 10 diagrammatically shows electrical resonance curves of the device of FIG. 9.

FIG. 10 shows three resonance curves A1, A2 and A3 obtained by measuring the admittance Y (expressed in Siemens) presented by the electromechanical device 9 between its first connection terminal (connected to the first electrodes 10) and its second connection terminal (connected to the second electrodes 20), according to the frequency f (expressed in MegaHertz). The curve A3 is obtained as a short-circuit in the first electrodes 30 with the second electrodes 40, for the tuning transducers $T_T$ (Z=0). The curve A1 is obtained on the contrary in an open circuit (infinite Z), and the curve A2 is obtained by connecting an intermediate capacitor of 3 picofarad between the first electrodes 30 and the second electrodes 40.

As can be seen in FIG. 10, the electromechanical device 9 has a clean electric resonance, with a satisfactory range of tunability. This range of tunability is however slightly less than in the case of the device 8 of FIG. 8, and the resonance is less separated from the anti-resonance. The parasitic resonances (corresponding to localised modes) are generally somewhat more marked that for the device 8 of FIG. 8. These observations can be explained by the fact that the number of electric potential transfer fingers is more substantial for this example (this number being here equal to 10) than for the resonator 80, thus increasing the extent of the partial reflections at the interface between two successive transducers.

Different alternatives can be brought to surface wave electromechanical devices 5; 8; 9 that have just been presented, in order to further improve their performances (agility in frequency in particular).

For example different crystalline orientations could be chosen, for the lithium niobate substrate (or another type of substrate could be chosen), in order to obtain a higher electromechanical coupling coefficient. Thus, rather than using the cross-section X, orientations Y+64° or Y+128° could be used.

Reflectors that comprise a number of fingers (number of periods) that is different could be used, for example a larger number of fingers, in order to improve their reflection coefficient, and therefore the quality factor of the resonators.

A decrease in the overall dimensions of the resonator (in particular a decrease in the pitch between successive fingers) would make it possible to increase the operating frequency (higher resonance frequency).

Moreover, instead of using a monocrystalline substrate as a support, recourse may be had to a multilayer structure, which authorises the use of waves that are better confined near the surface, faster, and having a lesser drift in their propagation characteristics with the temperature.

Plate Wave Resonators

Figure 12:
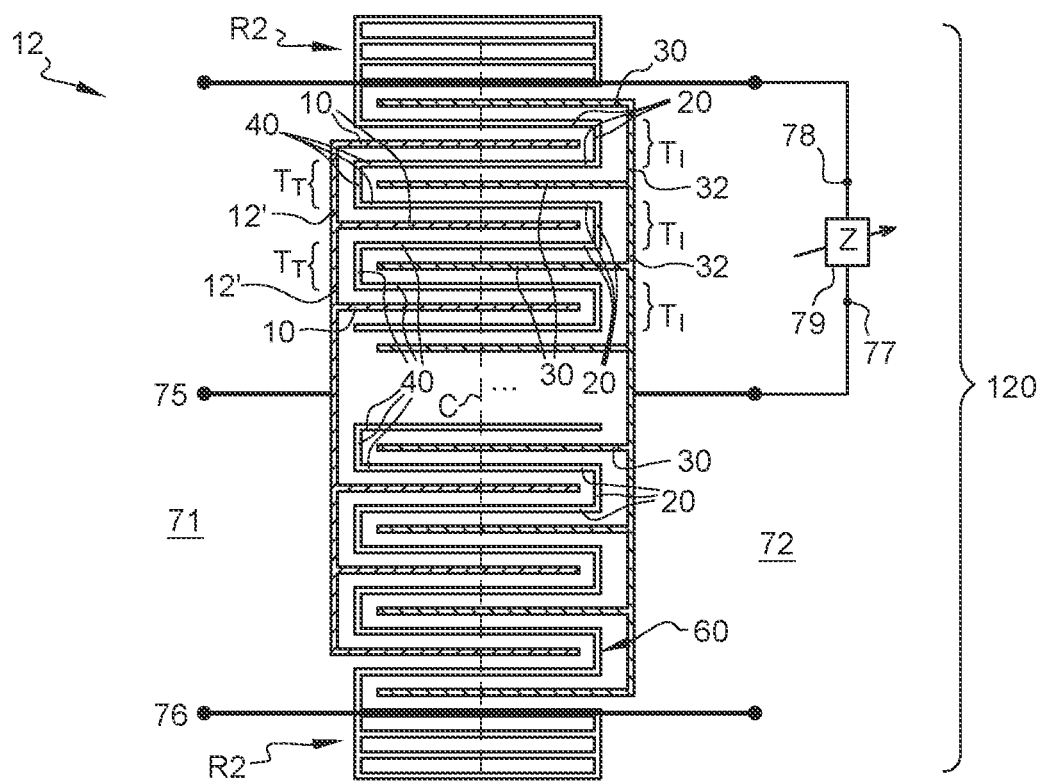
FIG. 12 diagrammatically shows the device of FIG. 11, seen from above.
Figure 14:
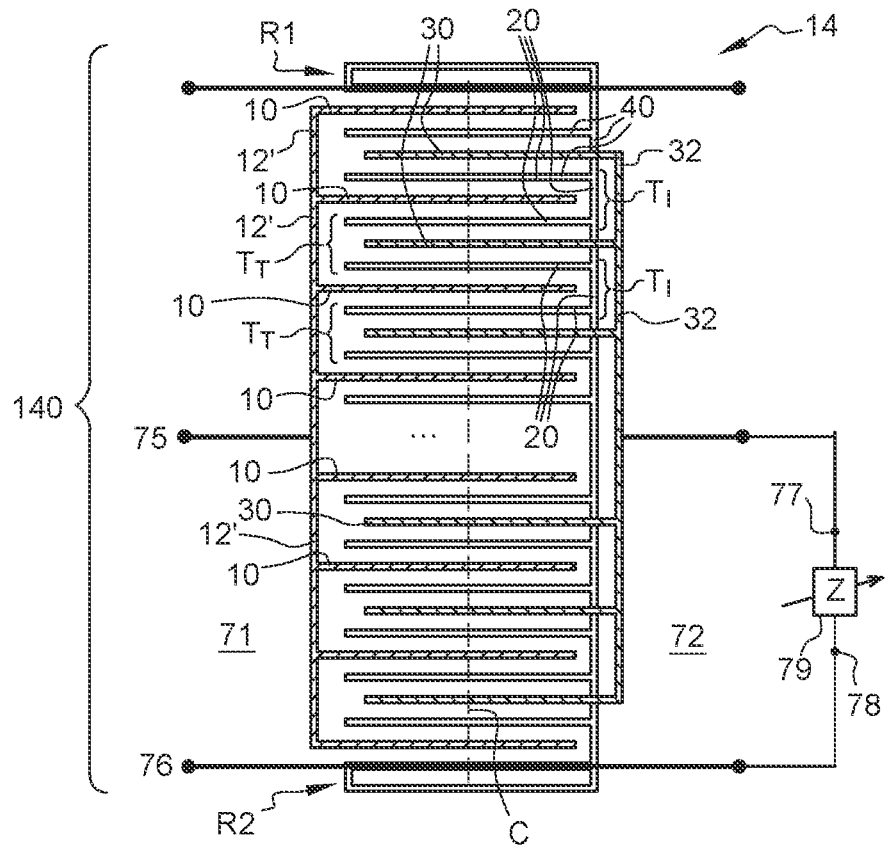
FIG. 14 diagrammatically shows another electromechanical device comprising a frequency-agile plate wave resonator, seen from above.

The fourth, fifth and sixth embodiments of the electromechanical device, 12; 14 and 16, for which the resonator is a plate wave resonator, are presented now, in reference to FIGS. 12, 14 and 16 respectively.

As already indicated, for these three embodiments, the support 200 is a thin plate, of a thickness generally less than 6 wavelengths (or 12 times the period of the electrodes).

Here, this entails a lithium niobate plate as a cross-section X, the thickness $e_S$ of which is 0.39 microns. The reflectors R1 and R2 are arranged in such a way that the axis of propagation of the elastic waves in the resonator, axis that connects these two reflectors, creates, in the cutting plane, an angle of 170 degrees with the crystallographic axis Y.

The electrodes of the transducers, the reflectors and the electrical connection tracks are made from a conductive material, for example a metal material. Here, they are made from aluminium. Their thickness (extension perpendicularly to the surface S) is typically comprised between 0.01 and 1 micron; Here, for example, it is 235 nanometres. The transducers and the reflectors are made with a metallisation ratio comprised for example between 10 and 60% (here, about 30%). The different fingers 11, 21, 31, 41, of the electrodes of the transducers and of the reflectors R1, R2 are separated two-by-two by a spatial period of 2.3 microns, here, and each have a width (specific extension, parallel to the propagation path C), of 0.7 microns. A metallisation ratio that is slightly lower than for the surface wave resonators is used, in order to reduce the reflection coefficient of the wave at each electrode, and thus prevent the locating of waves in a single region of the resonator.

Indeed, as the thickness of the electrodes is comparable to that of the plate 200, a plate wave undergoes a rather strong reflection during the passage thereof under each electrode finger (the corresponding reflection coefficient can for example reach 30%). In these conditions, the elastic couplings between sets of successive teeth quickly become low, along the propagation path C. It is therefore desirable, for these plate wave resonators 120; 140, to practically successively alternate a finger 11, 21 allowing for the electrical interfacing of the resonator, and a finger 31, 41 allowing for frequency control.

Also, for this type of resonator, it is provided that each one of the electrodes, 10, 20, 30, and 40 comprises at most three fingers.

More precisely, in the fourth and fifth embodiments (FIGS. 12 and 14 respectively), each one of the first electrodes 10 and 30 comprises a single finger, and each one of the second electrodes 20 and 40 comprises only two fingers, that enclose the single finger of the corresponding first electrode. Thus, each transducer comprises a total of three fingers, for these two embodiments.

For these three plate wave resonator devices 12; 14; 16, the electrodes 10, 20, 30, 40 of the transducers are, here again, electrically connected to one another by electrical tracks, 12, 22, 32 and 42, each made on one or on the other of the two surfaces S1 and S2 of the support 200. The tracks that are made on the same surface of this support, S1 or S2, do not overlap.

In the fourth embodiment (FIGS. 11 and 12), the different elements of the resonator 120, i.e. the reflectors R1, R2, the transducers $T_T$, $T_I$ and the connection tracks, 12, 22, 32, 42, are made on the same surface, S1, of the support 200. In order to prevent overlapping between tracks, there is then recourse to the same arrangements as for devices 8 and 9, with surface waves, presented hereinabove.

For the interfacing transducers $T_I$, the first electrodes 10 are connected to one another by first tracks 12' located entirely on the first side 71 of the propagation path C. And the second electrodes 20 are connected to one another by second tracks 22 located, also, entirely on the first side 71 of the propagation path.

And for the tuning transducers $T_T$, the first electrodes 30 are connected to one another by third tracks 32 located entirely on a second side 72 of the propagation path C. And the second electrodes 40 are connected to one another by fourth tracks 42 located, also, entirely on the second side 72 of the propagation path.

Here, as the first electrodes 10 each have a single finger, the assembly comprising these first electrodes 10, and the first tracks 12' that connect them, form a comb, the body of which extends parallel to the path C, on the first side 71 of this path, over practically the entire length of the propagation path, and each finger of which is formed by one of the first electrodes 10, i.e. by the unique finger of this electrode.

The assembly comprising the first electrodes 30, and the first tracks 32 that connect them, also form a comb, the body of which extends parallel to the path C, on the second side 72 of this path, over practically the entire length of this propagation path, and of which each finger is formed by one of the first electrodes 30 (i.e. by the unique finger of this electrode). The two combs in question are interdigitated: the finger, constituted by each one of the first electrodes 10, is inserted between two fingers, each constituting one of the first electrodes 30.

Concerning the second electrodes 20 and 40 and second tracks 22, 42 that connect them, they form together the same main track 60 that meanders along the propagation path C, on either side of this path, alternatively circumventing a first electrode 10 with a single finger (circumventing by passing on the second side 72), then a first electrode 30 with a single finger (circumventing by passing on the first side 71), and so on. This main track 60 is formed here from a strip of a single piece, that thus meanders along the propagation path C (the fingers 21 and 41 second electrodes 20 and 40 are confounded two-by-two, and a single finger 21/41 separates an electrode 10 from the next electrode 30). This strip has for example a constant width.

Figure 11:
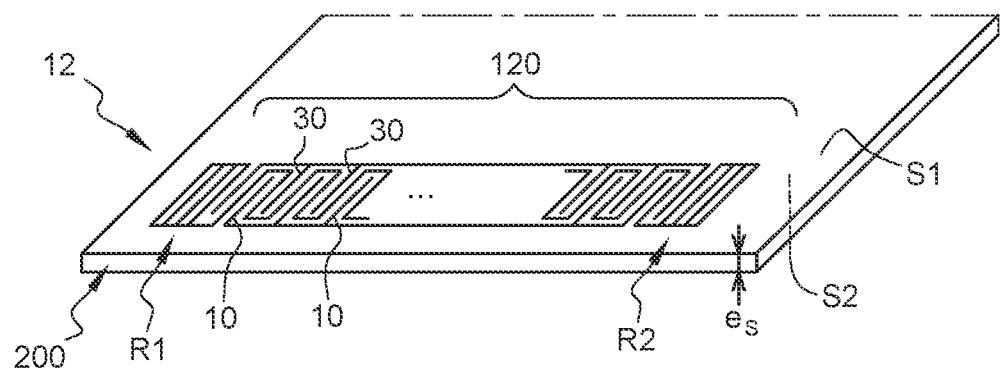
FIG. 11 diagrammatically shows an electromechanical device comprising a frequency-agile plate wave resonator, seen in perspective.

In FIGS. 11 and 12, only a portion of the fingers of the resonator 120 are shown. In practice, the resonator 120, as the other resonators 50; 80; 90; 140 described here, comprise a total number of fingers (not including reflectors) greater than or equal to 40, even greater than or equal to 80, or even greater than 150. Using a high total number of fingers makes it possible in particular to obtain an impedance that is relatively close to 50 Ohms, between the first and the second terminal of the electromechanical device (outside of the resonance and anti-resonance frequencies, of course).

Figure 13:
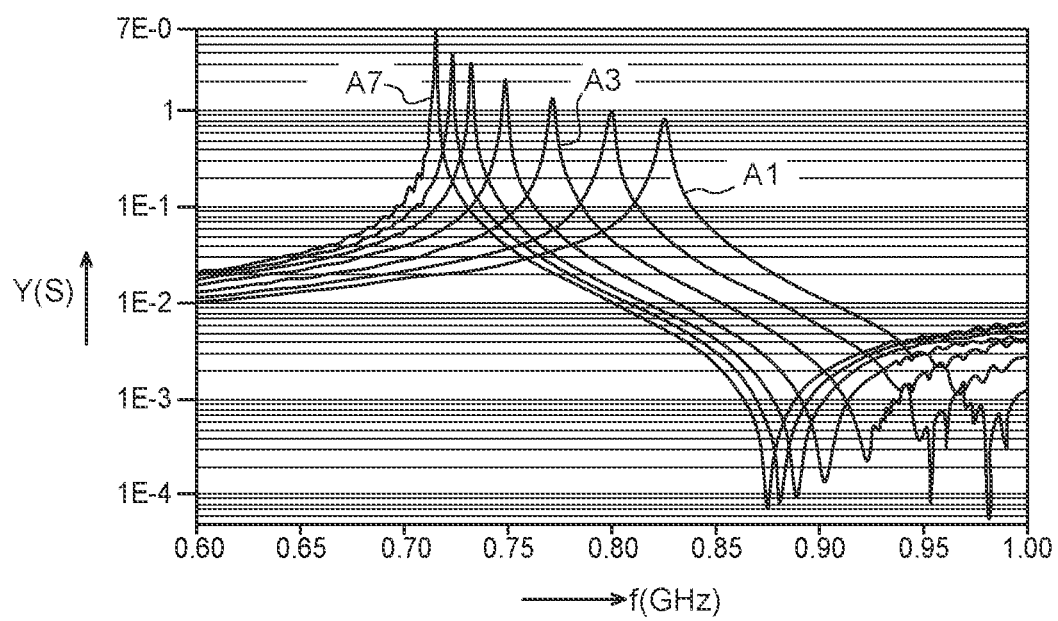
FIG. 13 diagrammatically shows electrical resonance curves of the device of FIG. 11.

FIG. 13 shows the admittance Y presented by the device 12 between its first and second connection terminal 75 and 76 (expressed in Siemens), according to the frequency f (in GigaHertz). Seven electrical resonance curves, obtained via digital simulations are shown. The curve A7 is obtained by short-circuiting the first electrodes 30 with the second electrodes 40, for the tuning transducers $T_T$ (Z=0). The curve A1 is obtained by connecting a 1 pF capacitor between these same electrodes, and the curve A3 is obtained by connecting a 4 pF capacitor between the first electrodes 30 and the second electrodes 40.

As can be seen in FIG. 13, the plate wave resonator device 12 makes it possible to obtain:
- a very wide range of tunability (about 0.1 GHz, or 14% of the average resonance frequency), the width of which is at least equal to 10 times the width at −3 dB of the resonance peak,
- a very fine resonance peak, and
- an anti-resonance and a resonance that are particularly well separated.

In the fifth and sixth embodiments (shown respectively in FIGS. 15 and 16), some electrodes are made on the first surface S1 of the support of the electromechanical device 14; 16 (upper surface), while the other electrodes are made on the second surface S2 of this support (lower surface). This can complicate the manufacture of the device 14; 16 (with respect to the device 12 of FIGS. 11 and 12), but however simplifies the connection between electrodes, since this limits the possibilities of overlapping.

In the fifth embodiment (FIGS. 14 and 15), the second electrodes 20 of the interfacing transducers $T_I$, and the second electrodes 40 of the tuning transducers $T_T$ are in electrical contact and together form the same common electrical ground. These electrodes 20, 40, and the electrical tracks that connect them are made on the second surface S2 of the support 200, as can be seen in FIG. 15. FIG. 15 is a diagrammatical cross-section view of a portion of the device 14, along a cutting plane perpendicular to the support 200 and containing the propagation path C.

The first electrodes 10 of the interfacing transducers $T_I$, and the first electrodes 30 of the tuning transducers $T_T$ are made on the first surface S1 of the support. Note that FIG. 14 is a top view of the device 14, wherein the support 200 is not visible (it is, in a manner of speaking, shown in transparency). Thus, in this figure, some tracks or fingers seems to cross but, as they are in fact made on different surfaces, they do not cross, in fact.

The assembly comprising the first electrodes 10 (with a single finger) and the first tracks 12' that connect them together form a comb, the body of which is located on the first side 71 of the propagation path (as in the fourth embodiment). And the assembly comprising the first electrodes 30 (with a single finger) and the first tracks 32 that connect them form a comb, the body of which is located on the second side 72 of the propagation path (these two combs being interdigitated with one another).

The ground track, formed by all the second electrodes 20 and 40, also forms a comb, with a main body located on the first or on the second side (here the second side) of the propagation path, and fingers that (in projection on the surface S1) each extend between one of the first electrodes 10, and the neighbouring first electrode 30. Here, for each pair comprising one of the first electrodes 10, and the neighbouring first electrode 30, a single finger of this ground track is inserted between the first electrode 10 and the first electrode 30 in question.

In the sixth embodiment, the interfacing transducers $T_I$ are made on the first surface S1 of the support 200, while the tuning transducers $T_T$ are made on the second surface S2 of the support 200, as can be seen in FIG. 16. FIG. 16 is a cross-section view of a portion of the device 16 according to this sixth embodiment, with the cutting plane being perpendicular to the support (i.e. perpendicular to the surfaces S1 and S2) and containing the propagation path C. In this sixth embodiment, each electrode 10, 20, 30, 40 comprises a single finger (and each transducer thus comprises a total of two fingers).

The interfacing transducers together form two long combs (one for the first electrodes, the other for the second electrodes), interdigitated with one another, and which extend practically all along the propagation path. Likewise, the tuning transducers as a whole form two long combs, interdigitated with one another, and which extend practically all along the propagation path.

As already indicated, each tuning transducer $T_T$ is inserted between two interfacing transducers $T_I$, except for the control traducer or transducers $T_T$ located at the ends of the propagation path. Thus, in projection on one of the two surfaces S1, S2, the tuning transducer $T_T$ in question is located (in a manner of speaking inserted) between the two interfacing transducers $T_I$ (FIG. 16).

Different alternatives can be made to the electromechanical devices 5; 8; 9; 12; 14; 16 described hereinabove.

In particular, the transducers could comprise a number of fingers that is different from what was presented.

The number of fingers per transducer can in particular be chosen in accordance with the reflection coefficient desired for the elastic waves at each finger and/or according to the target application, more or less tolerant to the presence of parasitic resonances corresponding to modes localised over a portion only of the resonator.

When the reflection coefficient expected at each finger is low, for example because the electrodes are not very thick, a relatively high number of fingers per transducer can be used. By way of example, if this coefficient is less than 5%, a total number of fingers per transducer can be chosen that is higher than 10 (that said, a smaller number can also be suitable, in this case). On the other hand, if the reflection coefficient in question is greater than 20%, for example, a total number of fingers per transducer less than or equal to three or four will then desirably be chosen.

Regarding now the target application, for a filter, for example, comprised of so-called series resonators, the resonance frequency of which is located in the middle of the band of the filter, and of parallel resonators the anti-resonance frequency of which is located at the centre of this same band, for the series resonators, the presence of a parasitic resonance (therefore falling potentially in the band of the filter) will be more detrimental than for the parallel resonators. For the series resonators, a reduced total number of fingers per transducer (for example less than or equal to 10) will desirably be chosen.

The invention claimed is:

1. An electromechanical device having an adjustable resonance frequency, comprising:
    a piezoelectric support delimited by a surface, or by two surfaces parallel to each other, and
    made on the piezoelectric support, a resonator for elastic waves propagating parallel to said surface or surfaces, the resonator comprising at least:
        two reflectors that delimit the resonator and which are reflective for said elastic waves,
        between the two reflectors, several interfacing transducers configured to generate said elastic waves from an electrical signal, and
        several tuning transducers for controlling said adjustable resonance frequency,
        each of said interfacing transducers comprising a first electrode and a second electrode that are interdigitated and each of said tuning transducers comprising a third and a fourth electrode that are interdigitated, each of said first, second, third and fourth electrodes made on said surface, or on one of said surfaces of the piezoelectric support, and
    an electrical device for controlling said adjustable resonance frequency, the electrical device comprising a first terminal and a second terminal and having between the first and second terminals an adjustable electrical impedance,
wherein:
    for each tuning transducer, the third electrode and the fourth electrode of the tuning transducer are respectively connected to the first terminal and to the second terminal of said electrical control device,
    the first electrodes of the several interfacing transducers are electrically connected to each other, and the second electrodes of the interfacing transducers are also electrically connected to each other, and
    the interfacing transducers and the tuning transducers are positioned along a propagation path followed by said elastic waves in the resonator with an alternation between interfacing transducers and tuning transducers, each tuning transducer being inserted between two successive interfacing transducers, or between one of the reflectors and one of the interfacing transducers.

2. The electromechanical device according to claim 1, wherein:
    for at least some of the interfacing transducers:
        the first electrodes are connected to each other by one or more first electrical tracks, and
        the second electrodes of the interfacing transducers are connected to each other by one or more second electrical tracks, and
    for at least some of said tuning transducers:
        the third electrodes are connected to each other by one or more third electrical tracks, and
        the fourth electrodes are connected to each other by one or more fourth electrical tracks,
wherein each of said one or more first, second, third and fourth electrical tracks is made on the surface, or on one of the two surfaces of the piezoelectric support.

3. The electromechanical device according to claim 2, wherein the one or more first, second, third and fourth electrical tracks that are made on a same surface of the piezoelectric support do not overlap with each other.

4. The electromechanical device according to claim 2, wherein:
    each electrode of said first, second, third and fourth electrodes comprises one or more fingers and a longitudinal conductive strip, from which extend said finger or fingers and which form a main body of the electrode,
    for the interfacing transducers:
        each of said second electrodes comprises at least one more finger than the first electrode with which it is associated, two peripheral fingers of the second electrode surrounding the complete set of fingers of the first electrode, the two peripheral fingers each having, opposite the main body of the second electrode, an end located on a first side of said propagation path, and wherein,
        each one of said second electrical tracks connects the end of one of the peripheral fingers of one of said second electrodes to the end of one of the peripheral fingers of the next second electrode, wherein main bodies of said second electrodes and their peripheral fingers forming, with the second electrical tracks, a global track that meanders along the propagation path, on either side of said propagation path, by circumventing the tuning transducers.

5. The electromechanical device according to claim 4, wherein, for each interfacing transducer, the main body of the second electrode of the interfacing transducer is connected to one of said second electrical tracks, not only by one of the peripheral fingers of the second electrode but also by one or more additional fingers that extend transversally with respect to the propagation path, crossing the propagation path, the one or more additional fingers being located between the interfacing transducer considered and the tuning transducer adjacent to it.

6. The electromechanical device according to claim 4, wherein:
- each of said second electrical tracks forms, with the fourth electrode of one of the tuning transducers, a same longitudinal conductive strip located on the first side of the propagation path,
- each of said fourth electrical tracks forms, with the second electrode of one of the interfacing transducers a same longitudinal conductive strip located on the second side of the propagation path,
- the second electrodes of the interfacing transducers are in electrical contact with the fourth electrodes of the tuning transducers, at least via their peripheral fingers, the main bodies of the second electrodes and their peripheral fingers together forming a same main track that meanders along the propagation path, on either side of said propagation path, by circumventing the third electrodes of the tuning transducers and of the first electrodes of the interfacing transducers.

7. The electromechanical device according to claim 4, wherein:
- the first and second electrical tracks are located on the first side of the propagation path of the elastic waves, while
- the third and fourth electrical tracks are located on a second, opposite side of the propagation path of the elastic waves.

8. The electromechanical device according to claim 4, wherein
- the main body of each of said first electrodes is located on the first side of the propagation path, and the main body of each of said second electrodes is located on the second side of the propagation path, and
- each of said first electrical tracks connects the main body of one of the first electrodes to the main body of a next first electrode.

9. The electromechanical device according to claim 1, wherein said piezoelectric support forms a thin plate, delimited by said two surfaces, parallel to each other.

10. The electromechanical device according to claim 1, wherein the interfacing transducers and the tuning transducers are made on the same surface of said piezoelectric support.

11. The electromechanical device according to claim 9, wherein the interfacing transducers are made on one of the surfaces of the thin plate while the tuning transducers are made on the other surface of the thin plate.

12. The electromechanical device according to claim 9, wherein the second electrodes of the interfacing transducers are in electrical contact with the fourth electrodes of the tuning transducers, and wherein:
- either the first electrodes of the interfacing transducers,
- or the third electrodes of the tuning transducers, or the second electrodes of the interfacing transducers and the fourth electrodes of the tuning transducers are made on one of the surfaces of said thin plate, the other electrodes of the interfacing transducers and of the tuning transducers being made on the other surface of said thin plate.

13. The electromechanical device according to claim 1, wherein, the first and second electrodes each comprising one or more fingers that extend transversally with respect to said propagation path, for at least some of the first and second electrodes, the total number of fingers of the electrode is less than or equal to 10.

14. The electromechanical device according to claim 1, wherein, the first and second electrodes each comprising one or more fingers that extend transversally with respect to said propagation path, for at least some of the first and second electrodes, the total number of fingers of the electrode is comprised between 1 and 3.

15. The electromechanical device according to claim 1, wherein an assembly that groups together the first, second, third and fourth electrodes of the tuning transducers and of the interfacing transducers comprises a total number of electrode fingers greater than or equal to 40.

* * * * *